United States Patent
Carrender

(10) Patent No.: US 9,070,063 B2
(45) Date of Patent: Jun. 30, 2015

(54) RADIO FREQUENCY IDENTIFICATION (RFID) TAG FOR AN ITEM HAVING A CONDUCTIVE LAYER INCLUDED OR ATTACHED

(75) Inventor: Curt Carrender, Morgan Hill, CA (US)

(73) Assignee: Ruizhang Technology Limited Company, Shanghai (CN)

( * ) Notice: Subject to any disclaimer, the term of this patent is extended or adjusted under 35 U.S.C. 154(b) by 0 days.

(21) Appl. No.: 13/595,750

(22) Filed: Aug. 27, 2012

(65) Prior Publication Data

US 2012/0318872 A1 Dec. 20, 2012

Related U.S. Application Data

(63) Continuation of application No. 12/749,355, filed on Mar. 29, 2010, now Pat. No. 8,471,709, which is a continuation of application No. 11/033,347, filed on Jan. 10, 2005, now Pat. No. 7,688,206, which is a continuation-in-part of application No. 10/996,294, filed on Nov. 22, 2004, now Pat. No. 7,385,284.

(51) Int. Cl.
| | | |
|---|---|---|
| G08B 13/14 | (2006.01) | |
| G06K 19/07 | (2006.01) | |
| G06K 19/077 | (2006.01) | |

(Continued)

(52) U.S. Cl.
CPC ....... *G06K 19/0723* (2013.01); *Y10T 29/49128* (2015.01); *Y10T 29/49016* (2015.01); *Y10T 29/49155* (2015.01); *G06K 19/07788* (2013.01); *G08B 13/2417* (2013.01); *G08B 13/2437* (2013.01); *G08B 13/2445* (2013.01); *H01L 24/24* (2013.01); *H01L 24/82* (2013.01); *H01L 2224/24227* (2013.01); *H01L 2224/7665* (2013.01); *H01L 2224/82039* (2013.01); *H01L 2224/95085* (2013.01); *H01L 2924/01027* (2013.01); *H01L 2924/01075* (2013.01); *H01L 2924/14* (2013.01); *H01L 2924/15155* (2013.01); *H01L 2924/15165* (2013.01); *H01L 2924/01033* (2013.01); *H01L 2924/014* (2013.01)

(58) Field of Classification Search
None
See application file for complete search history.

(56) References Cited

U.S. PATENT DOCUMENTS

| | | |
|---|---|---|
| 2,551,591 A | 5/1951 | Foord |
| 3,024,151 A | 3/1962 | Robinson |
| 3,390,308 A | 6/1968 | Marley |

(Continued)

FOREIGN PATENT DOCUMENTS

| | | |
|---|---|---|
| DE | 2810005 | 3/1978 |
| DE | 2810054 | 9/1978 |

(Continued)

OTHER PUBLICATIONS

Electronics Review, Electronics, Jul. 24, 1967, pp. 36-28, 3 pages.

(Continued)

*Primary Examiner* — Benjamin Sandvik
(74) *Attorney, Agent, or Firm* — Blakely, Sokoloff, Taylor & Zafman LLP

(57) ABSTRACT

An RFID device. The device comprises a conductive layer formed on a first substrate. An opening line (or two or more opening lines) is formed in the conductive layer to make the conductive layer a part of an antenna structure. An integrated circuit chip is placed over at least a portion the opening line and coupled to the conductive layer. The integrated circuit chip is electrically interconnected to the conductive layer.

20 Claims, 20 Drawing Sheets

(51) Int. Cl.
  *G08B 13/24*  (2006.01)
  *H01L 23/00*  (2006.01)

(56) References Cited

U.S. PATENT DOCUMENTS

| | | |
|---|---|---|
| 3,440,027 A | 4/1969 | Hugle |
| 3,458,382 A | 7/1969 | Buck |
| 3,689,991 A | 9/1972 | Aird |
| 3,708,860 A | 1/1973 | Bolster et al. |
| 3,724,737 A | 4/1973 | Bodnar |
| 3,891,157 A | 6/1975 | Justus |
| 3,903,590 A | 9/1975 | Yokogawa |
| 3,989,575 A | 11/1976 | Davies et al. |
| 4,331,957 A | 5/1982 | Enander et al. |
| 4,334,672 A | 6/1982 | Felix |
| 4,670,770 A | 6/1987 | Tai |
| 4,783,646 A | 11/1988 | Matsuzaki |
| 4,783,695 A | 11/1988 | Eichelberger et al. |
| 4,795,898 A | 1/1989 | Bernstein et al. |
| 4,818,855 A | 4/1989 | Mongeon et al. |
| 4,857,893 A | 8/1989 | Carroll |
| 4,918,811 A | 4/1990 | Eichelberger et al. |
| 4,937,653 A | 6/1990 | Blonder et al. |
| 4,957,776 A | 9/1990 | Higuchi et al. |
| 4,990,462 A | 2/1991 | Sliwa, Jr. |
| 5,008,213 A | 4/1991 | Kolesar |
| 5,032,896 A | 7/1991 | Little et al. |
| 5,048,179 A | 9/1991 | Shindo et al. |
| 5,049,978 A | 9/1991 | Bates et al. |
| 5,083,697 A | 1/1992 | Difrancesco |
| 5,099,227 A | 3/1992 | Geiszler et al. |
| 5,138,433 A | 8/1992 | Hiruta |
| 5,138,436 A | 8/1992 | Koepf |
| 5,188,984 A | 2/1993 | Nishiguchi |
| 5,205,032 A | 4/1993 | Kuroda |
| 5,212,625 A | 5/1993 | van Andel et al. |
| 5,221,831 A | 6/1993 | Geiszler et al. |
| 5,231,751 A | 8/1993 | Sachdev et al. |
| 5,241,456 A | 8/1993 | Marcinkiewicz et al. |
| D343,261 S | 1/1994 | Eberhardt et al. |
| 5,298,685 A | 3/1994 | Bindra et al. |
| 5,353,498 A | 10/1994 | Fillion et al. |
| D353,343 S | 12/1994 | Eberhardt et al. |
| 5,373,627 A | 12/1994 | Grebe |
| 5,378,880 A | 1/1995 | Eberhardt et al. |
| 5,382,784 A | 1/1995 | Eberhardt et al. |
| 5,382,952 A | 1/1995 | Miller |
| 5,420,757 A | 5/1995 | Eberhardt et al. |
| 5,422,513 A | 6/1995 | Marcinkiewicz |
| 5,430,441 A | 7/1995 | Bickley et al. |
| 5,434,751 A | 7/1995 | Cole, Jr. et al. |
| 5,435,057 A | 7/1995 | Bindra et al. |
| 5,444,223 A | 8/1995 | Blama |
| RE35,119 E | 12/1995 | Blonder |
| 5,514,613 A | 5/1996 | Santadrea et al. |
| 5,517,752 A | 5/1996 | Sakata et al. |
| 5,528,222 A | 6/1996 | Moskowitz et al. |
| 5,545,291 A | 8/1996 | Smith et al. |
| 5,554,996 A | 9/1996 | Chatzipetros |
| 5,557,470 A | 9/1996 | Shibayama |
| 5,565,846 A | 10/1996 | Geiszler et al. |
| 5,566,441 A | 10/1996 | Marsh et al. |
| 5,574,470 A | 11/1996 | De Vall |
| D378,578 S | 3/1997 | Eberhardt et al. |
| 5,612,254 A | 3/1997 | Mu et al. |
| 5,627,931 A | 5/1997 | Ackley et al. |
| 5,645,932 A | 7/1997 | Uchibori |
| 5,682,143 A | 10/1997 | Brady et al. |
| 5,707,902 A | 1/1998 | Chang et al. |
| 5,708,419 A | 1/1998 | Isaacson et al. |
| 5,715,594 A | 2/1998 | Patterson et al. |
| 5,735,040 A | 4/1998 | Ochi et al. |
| 5,745,984 A | 5/1998 | Cole, Jr. et al. |
| 5,754,110 A | 5/1998 | Appalucci et al. |
| 5,779,839 A | 7/1998 | Tuttle et al. |
| 5,783,856 A | 7/1998 | Smith et al. |
| 5,798,050 A | 8/1998 | Gaynes et al. |
| 5,818,348 A | 10/1998 | Walczak et al. |
| 5,824,186 A | 10/1998 | Smith et al. |
| 5,862,117 A | 1/1999 | Fuentes et al. |
| 5,904,545 A | 5/1999 | Smith et al. |
| 5,910,770 A | 6/1999 | Ohara |
| 5,914,862 A | 6/1999 | Ferguson et al. |
| 5,995,006 A | 11/1999 | Walsh |
| 6,018,299 A | 1/2000 | Eberhardt et al. |
| 6,019,284 A | 2/2000 | Freeman et al. |
| 6,031,450 A | 2/2000 | Huang |
| 6,040,773 A | 3/2000 | Vega |
| 6,044,046 A | 3/2000 | Diezmann et al. |
| 6,064,116 A | 5/2000 | Akram |
| 6,078,791 A | 6/2000 | Tuttle |
| 6,082,660 A | 7/2000 | Meyer |
| 6,091,332 A | 7/2000 | Eberhardt et al. |
| 6,094,138 A | 7/2000 | Eberhardt et al. |
| 6,094,173 A | 7/2000 | Nylander |
| 6,100,804 A | 8/2000 | Brady et al. |
| 6,107,920 A | 8/2000 | Eberhardt et al. |
| 6,122,492 A | 9/2000 | Sears |
| 6,133,833 A | 10/2000 | Sidlauskas et al. |
| 6,133,835 A | 10/2000 | De Leeuw et al. |
| 6,134,130 A | 10/2000 | Connell |
| 6,140,146 A | 10/2000 | Brady et al. |
| 6,147,605 A | 11/2000 | Vega et al. |
| 6,147,662 A | 11/2000 | Grabau et al. |
| 6,164,551 A | 12/2000 | Altwasser |
| 6,181,287 B1 | 1/2001 | Beigel |
| 6,189,208 B1 | 2/2001 | Estes et al. |
| 6,194,119 B1 | 2/2001 | Wolk et al. |
| 6,195,858 B1 | 3/2001 | Ferguson et al. |
| 6,198,875 B1 | 3/2001 | Edenson et al. |
| 6,204,163 B1 | 3/2001 | Panchou et al. |
| 6,206,282 B1 | 3/2001 | Hayes et al. |
| 6,211,572 B1 | 4/2001 | Fjelstad et al. |
| 6,219,911 B1 | 4/2001 | Estes et al. |
| 6,222,212 B1 | 4/2001 | Lee et al. |
| 6,229,203 B1 | 5/2001 | Wojnarowski et al. |
| 6,229,442 B1 | 5/2001 | Rolin |
| 6,236,316 B1 | 5/2001 | Eberhardt et al. |
| 6,246,327 B1 | 6/2001 | Eberhardt et al. |
| 6,252,508 B1 | 6/2001 | Vega et al. |
| 6,259,408 B1 | 7/2001 | Brady et al. |
| 6,262,692 B1 | 7/2001 | Babb |
| 6,265,977 B1 | 7/2001 | Vega et al. |
| 6,268,796 B1 | 7/2001 | Gnadinger et al. |
| 6,271,801 B2 | 8/2001 | Tuttle et al. |
| 6,274,391 B1 | 8/2001 | Wachtler et al. |
| 6,274,508 B1 | 8/2001 | Jacobsen et al. |
| 6,275,156 B1 | 8/2001 | Rasband |
| 6,275,681 B1 | 8/2001 | Vega et al. |
| 6,280,544 B1 | 8/2001 | Fox et al. |
| 6,281,038 B1 | 8/2001 | Jacobsen et al. |
| 6,281,794 B1 | 8/2001 | Duan et al. |
| 6,282,407 B1 | 8/2001 | Vega et al. |
| 6,291,896 B1 | 9/2001 | Smith |
| 6,297,072 B1 | 10/2001 | Tilmans et al. |
| 6,309,912 B1 | 10/2001 | Chiou et al. |
| 6,313,747 B2 | 11/2001 | Imaichi et al. |
| 6,320,543 B1 | 11/2001 | Ohata et al. |
| 6,320,753 B1 | 11/2001 | Launay |
| 6,329,213 B1 | 12/2001 | Tuttle et al. |
| 6,329,917 B1 | 12/2001 | Leonard |
| 6,357,005 B1 | 3/2002 | Devaux et al. |
| 6,366,468 B1 | 4/2002 | Pan |
| 6,384,425 B1 | 5/2002 | Huber et al. |
| 6,392,213 B1 | 5/2002 | Martorana et al. |
| 6,395,373 B2 | 5/2002 | Conti et al. |
| 6,410,415 B1 | 6/2002 | Estes et al. |
| 6,417,025 B1 | 7/2002 | Gengel et al. |
| 6,420,266 B1 | 7/2002 | Smith et al. |
| 6,448,109 B1 | 9/2002 | Karpman |
| 6,451,154 B1 | 9/2002 | Grabau et al. |
| 6,459,084 B1 | 10/2002 | Boreman et al. |
| 6,459,588 B1 | 10/2002 | Morizumi et al. |
| 6,468,638 B2 | 10/2002 | Jacobsen et al. |

(56) References Cited

U.S. PATENT DOCUMENTS

| | | |
|---|---|---|
| 6,486,780 B1 | 11/2002 | Garber et al. |
| 6,514,790 B1 | 2/2003 | Plettner et al. |
| 6,523,734 B1 | 2/2003 | Kawai et al. |
| 6,528,351 B1 | 3/2003 | Nathan et al. |
| 6,530,649 B1 | 3/2003 | Pan |
| 6,536,674 B2 | 3/2003 | Kayanakis et al. |
| 6,542,444 B1 | 4/2003 | Rutsche |
| 6,549,064 B2 | 4/2003 | Bandy et al. |
| 6,559,666 B2 | 5/2003 | Bernier et al. |
| 6,574,166 B2 * | 6/2003 | Niemiec ......................... 368/10 |
| 6,590,346 B1 | 7/2003 | Hadley et al. |
| 6,606,247 B2 | 8/2003 | Credelle et al. |
| 6,611,237 B2 | 8/2003 | Smith |
| 6,653,157 B2 | 11/2003 | Kondo |
| 6,665,044 B1 | 12/2003 | Jacobsen et al. |
| 6,677,186 B1 | 1/2004 | Zafrany et al. |
| 6,696,785 B2 | 2/2004 | Shimoda et al. |
| 6,727,970 B2 | 4/2004 | Grace et al. |
| 6,779,733 B2 | 8/2004 | Akita |
| 6,780,696 B1 | 8/2004 | Schatz |
| 6,794,221 B2 | 9/2004 | Sayyah |
| 6,816,380 B2 | 11/2004 | Credelle et al. |
| 6,841,419 B2 | 1/2005 | Akita |
| 6,844,673 B1 | 1/2005 | Bernkopf |
| 6,850,312 B2 | 2/2005 | Jacobsen et al. |
| 6,853,087 B2 | 2/2005 | Neuhaus et al. |
| 6,853,345 B2 | 2/2005 | King et al. |
| 6,856,086 B2 | 2/2005 | Grace et al. |
| 6,863,219 B1 | 3/2005 | Jacobsen et al. |
| 6,864,570 B2 | 3/2005 | Smith et al. |
| 6,867,983 B2 | 3/2005 | Liu et al. |
| 6,908,295 B2 | 6/2005 | Thielman et al. |
| 6,919,680 B2 | 7/2005 | Shimoda et al. |
| 6,951,569 B2 | 10/2005 | Green et al. |
| 6,951,596 B2 | 10/2005 | Green et al. |
| 6,957,481 B1 | 10/2005 | Patrice |
| 6,985,361 B2 | 1/2006 | Credelle et al. |
| 7,014,729 B2 | 3/2006 | Grabau et al. |
| 7,017,807 B2 | 3/2006 | Kipp et al. |
| 7,034,689 B2 | 4/2006 | Teplitzky et al. |
| 7,045,186 B2 | 5/2006 | Grabau et al. |
| 7,046,328 B2 | 5/2006 | Jacobsen et al. |
| 7,102,520 B2 | 9/2006 | Liu et al. |
| 7,113,250 B2 | 9/2006 | Jacobsen et al. |
| 7,120,987 B2 | 10/2006 | Liu et al. |
| 7,158,037 B2 | 1/2007 | Forster et al. |
| 7,236,093 B2 | 6/2007 | Stromberg |
| 7,260,247 B2 | 8/2007 | Kita |
| 7,260,882 B2 | 8/2007 | Credelle et al. |
| 7,298,330 B2 | 11/2007 | Forster et al. |
| 7,353,598 B2 | 4/2008 | Craig et al. |
| 7,361,251 B2 | 4/2008 | Green et al. |
| 7,368,032 B2 | 5/2008 | Green et al. |
| 7,598,876 B2 | 10/2009 | Fidelis et al. |
| 2001/0000631 A1 | 5/2001 | Zandman et al. |
| 2001/0028308 A1 | 10/2001 | De La Huerga |
| 2001/0030628 A1 | 10/2001 | Brady et al. |
| 2001/0031514 A1 | 10/2001 | Smith |
| 2001/0035759 A1 | 11/2001 | Bernier et al. |
| 2001/0055835 A1 | 12/2001 | Pendse |
| 2002/0001046 A1 | 1/2002 | Jacobsen et al. |
| 2002/0018357 A1 | 2/2002 | Oguchi et al. |
| 2002/0041234 A1 | 4/2002 | Kuzma et al. |
| 2002/0061392 A1 | 5/2002 | Jacobsen et al. |
| 2002/0093396 A1 | 7/2002 | Smith et al. |
| 2002/0097664 A1 | 7/2002 | Ono |
| 2002/0114587 A1 | 8/2002 | Golwalkar et al. |
| 2002/0127864 A1 | 9/2002 | Smith et al. |
| 2002/0149107 A1 | 10/2002 | Chang et al. |
| 2002/0167450 A1 | 11/2002 | Korden et al. |
| 2003/0007421 A1 | 1/2003 | Niemiec et al. |
| 2003/0029921 A1 | 2/2003 | Akita et al. |
| 2003/0034400 A1 | 2/2003 | han et al. |
| 2003/0036249 A1 | 2/2003 | Bauer et al. |
| 2003/0054881 A1 | 3/2003 | Hedrick et al. |
| 2003/0080919 A1 * | 5/2003 | Forster et al. ................. 343/895 |
| 2003/0089444 A1 | 5/2003 | Melzer et al. |
| 2003/0112192 A1 * | 6/2003 | King et al. .................... 343/718 |
| 2003/0121986 A1 | 7/2003 | Stromberg et al. |
| 2003/0136503 A1 | 7/2003 | Green et al. |
| 2003/0148555 A1 | 8/2003 | Akita |
| 2003/0232174 A1 | 12/2003 | Chang et al. |
| 2004/0037053 A1 | 2/2004 | Akita |
| 2004/0052202 A1 | 3/2004 | Brollier |
| 2004/0052203 A1 | 3/2004 | Brollier |
| 2004/0054594 A1 | 3/2004 | Forster et al. |
| 2004/0089408 A1 | 5/2004 | Brod et al. |
| 2004/0142766 A1 | 7/2004 | Savarese et al. |
| 2005/0051624 A1 * | 3/2005 | Kipp et al. .................... 235/385 |
| 2005/0070375 A1 | 3/2005 | Savarese et al. |
| 2005/0093678 A1 | 5/2005 | Forster et al. |
| 2005/0122219 A1 | 6/2005 | Petersen et al. |
| 2005/0162277 A1 * | 7/2005 | Teplitxky et al. .......... 340/572.8 |
| 2005/0200539 A1 | 9/2005 | Forster et al. |
| 2005/0276210 A1 | 12/2005 | Reiter et al. |
| 2006/0012527 A1 | 1/2006 | Kai et al. |
| 2006/0022287 A1 | 2/2006 | Itoi et al. |
| 2006/0202830 A1 | 9/2006 | Scharfeld et al. |
| 2006/0210769 A1 | 9/2006 | Swindlehurst et al. |
| 2007/0031992 A1 | 2/2007 | Schatz |
| 2007/0046466 A1 | 3/2007 | Sakama et al. |
| 2008/0197042 A1 | 8/2008 | Ullrich |
| 2008/0223936 A1 | 9/2008 | Mickle et al. |
| 2010/0117794 A1 | 5/2010 | Adams et al. |

FOREIGN PATENT DOCUMENTS

| | | |
|---|---|---|
| DE | 3203943 | 8/1983 |
| DE | 8709503 | 12/1987 |
| DE | 4427309 | 8/1994 |
| DE | 19534480 | 9/1994 |
| DE | 19745648 | 10/1997 |
| DE | 19840226 | 3/2000 |
| DE | 19929610 | 10/2000 |
| DE | 10017431 | 10/2001 |
| EP | 0277606 | 8/1988 |
| EP | 0450950 | 10/1991 |
| EP | 0498703 | 8/1992 |
| EP | 0952543 | 10/1999 |
| EP | 0992939 | 4/2000 |
| EP | 1014302 | 6/2000 |
| EP | 1035418 | 9/2000 |
| EP | 1035503 | 9/2000 |
| EP | 1039543 | 9/2000 |
| EP | 1111537 | 6/2001 |
| EP | 1167068 | 1/2002 |
| EP | 1302893 | 4/2006 |
| EP | 1843280 | 10/2007 |
| FR | 2806029 | 3/2000 |
| GB | 2341166 | 3/2000 |
| JP | 10256429 | 9/1999 |
| JP | 11250207 | 9/1999 |
| JP | 11353439 | 12/1999 |
| JP | 2000231614 | 8/2000 |
| JP | 2001175837 | 6/2001 |
| WO | WO 88/02549 | 4/1988 |
| WO | WO 98/15981 | 4/1998 |
| WO | WO 98/54681 | 12/1998 |
| WO | WO 99/41701 | 8/1999 |
| WO | WO 99/41721 | 8/1999 |
| WO | WO 99/65002 | 12/1999 |
| WO | WO 00/14789 | 3/2000 |
| WO | WO 00/16493 | 3/2000 |
| WO | WO 00/23994 | 4/2000 |
| WO | WO 00/52109 | 9/2000 |
| WO | WO 01/02060 | 1/2001 |
| WO | WO 01/33621 | 5/2001 |
| WO | WO 01/54058 | 7/2001 |
| WO | WO 01/61646 | 8/2001 |
| WO | WO 01/62517 | 8/2001 |
| WO | WO 01/75789 | 10/2001 |
| WO | WO 01/95241 | 12/2001 |
| WO | WO 01/95252 | 12/2001 |
| WO | WO 02/49093 | 6/2002 |

(56) References Cited

FOREIGN PATENT DOCUMENTS

| WO | WO 02/089051 | 11/2002 |
|---|---|---|
| WO | WO 02/097724 | 12/2002 |
| WO | WO 03/063211 | 7/2003 |
| WO | WO 03/105063 | 12/2003 |
| WO | WO 2004/006259 | 1/2004 |
| WO | WO 2004/097731 | 11/2004 |

OTHER PUBLICATIONS

Gilleo, K, Handbook of Flexible Circuits, Chpt 2, Chpt 7, (1992) 11 pages.
Grossman, S.E."Film-Carrier Technique Automates the Packaging of IC Chips" May 16, 1974, pp. 89-95, 7 pages.
Hannke, Bittner & Partner, Opposition to the Grant of EP1470528, filed with the EPO, dated Feb. 16, 2007.
IPRP Chapter 1, PCT Application No. PCT/US2004/009070, (7 pages) mailed Oct. 13, 2005.
IPRP Chapter 1, PCT Application No. PCT/US2005/002534, (9 pages) mailed Aug. 10, 2006.
Kriebel, Frank (2005). RFID Chip and Tag Assembly Challenges: Low Cost RFID IC Packaging and Assembly Workshop, Nov. 14, 2005, Munich, Germany. (12 pgs).
Patstone, W., Edn, "Tape-Carrier packaging Boasts Almost Unlimited Potential" Oct. 1974, A Cahners Publication, 8 pages.
PCT International Search Report, PCT Application No. PCT US2005/002534. Mailed Nov. 11, 2005.
PCT International Written Opinion, PCT Application No. PCT US02/16474. Mailed Oct. 2002.
PCT International Written Opinion, PCT Application No. PCT US03/02115. (4 pages).
PCT Notification of Concerning Transmittal of Coy of International Preliminary Report on Patentability (Chapter 1 of the Patent Cooperation Treaty) for PCT/US2005/040772, mailed on May 31, 2007 (10 pages).
PCT Notification of Transmittal of International Preliminary Examination report for PCT Application No. PCT US02/16474. Mailed Jul. 21, 2005 (5 pages).
PCT Notification of Transmittal of International Search Report and the Written Opinion of the International Searching Authority for PCT/US2004/09070, mailed on Feb. 10, 2005 (12 pages).
PCT Notification of Transmittal of International Search Report and the Written Opinion of the International Searching Authority, or the Declaration for PCT/US2005/040772, mailed on Jul. 26, 2006 (15 pages).
PCT Search Report PCT/US00/02348 mailed Apr. 5, 2000; 5 pages
PCT Written Opinion Report, PCT Application No. PCT US2005/002534. Mailed Nov. 11, 2005 (7 pages).
Scrupski, S.E., "Ics on Film Strip Lead Themselves to Automatic Handling by Manufacturer and User, Too", Electronics, Feb. 1, 1971, ages 44-48, total 5 pages.
Van Der Drift, et al. PhilipsTechnical Review, "Integrated Circuits with Leads on Flexiable Tape" vol. 34(4), 1974 pp. 85-95, 11 pages.
PCT International Search Report for PCT/US2005/040772, mailed on Mar. 27, 2006 (5 pages).
Morley, Gearoid, "Radio Frequency 10 Tags, What They Are, How They Can Be Used and How Production Costs Can Be Reduced.", Aug. 2003, Automation Research Centre, University of Limerick, 9 pages.

* cited by examiner

RADIO FREQUENCY IDENTIFICATION (RFID) TAG FOR AN ITEM HAVING A CONDUCTIVE LAYER INCLUDED OR ATTACHED

RELATED APPLICATIONS

The present application is a Continuation of U.S. application Ser. No. 12/749,355, filed Mar. 29, 2010 now U.S. Pat. No. 8,471,709, which is Continuation of U.S. application Ser. No. 11/033,347 filed on Jan. 10, 2005 now U.S. Pat. No. 7,688,206 which is a Continuation In Part of application Ser. No. 10/996,294 filed on Nov. 22, 2004, now issued as U.S. Pat. No. 7,385,284.

FIELD

The present invention relates generally to incorporating a radio frequency (RF) transponder into a device to allow tagging for the device using an RFID system.

BACKGROUND

Systems for remote identification of objects are being used for many purposes, such as identifying an item or object in a warehouse, retailers, stores, dealerships, parking lots, airports, train stations and/or at any particular location. Such systems use Radio Frequency (RF) signals to communicate information between an RF reader apparatus and an RF transponder (tag) attached to the item or the object. The RF transponder includes a memory component that can store particular information, such as identification information (e.g., price, identification, serial number, product information, etc. . . . ) about the object or the item. Many RFID systems operate based on a passive powering system in which the RFID reader conveys energy to the RFID transponder. The RF transponder includes an antenna to receive the energy conveyed from the RFID reader and transfer the energy to the memory component in order to facilitate the communication between the RF reader and the RF transponder. Some systems include both "read" and "write" functions; thus, the RF reader can read information previously stored in the RF transponder's memory and the RF transponder can also write new information into the memory in response to signals from the RF reader.

Each RF transponder has an individual code containing information related to and identifying the associated object/item. In a typical system, the RF reader sends an RF signal to the remote RF transponder. The antenna in the RF transponder receives the signal from the RF reader, backscatter-modulates the received signal with data temporarily or permanently stored in the RF transponder (such as data indicating the identity prices, and/or contents of the object/item to which the transponder is attached), produces a sequence of signals in accordance with the transponder's individual code, and reflects this modulated signal back to the RF reader to pass the information contained in the RF transponder to the RF reader. The RF reader decodes these signals to obtain the information from the transponder. Likewise, the transponder may decode signals received from the reader and write information to the transponder's memory.

Tagging an object or an item is an important application. Tagging an object or an item includes at least identifying, authenticating, recognizing, inventorying, checking-in, checking-out, tracking, locating, detecting and sensing the electronic device for many purposes. For instance, there have been many attempts to tag an item such as a CD or a DVD. CD, a DVD, a merchandise, or the like. Such tagging has been employing an RFID system. Attempts have been made to place an RFID transponder on the cover or jacket of the CD or the DVD item. However, current tagging technology employing RFID systems do not successfully read the items/objects 100% of the time, especially without adding complex components to the items to booster the read accuracy. Additionally, the transponder is only placed on the jacket or cover of the item such as CDs/DVDs thus allowing for possible removal or tampering of the RFID transponder and possibly removing the CDs/DVDs from actual item from the jackets or the covers. Such possible removal the actual CDs or DVDs items from the covers defeat the purpose of tagging. Most importantly, the current tagging technology employs only a short range detection (13.56 MHz) thus does not provide for a long range detection.

Merchants, sellers, buyers, surveyors, retailers, libraries, pharmacies, hospitals, and the like who distribute, sell, or otherwise require information for particular items have the need to track, tag, and/or authenticate object/items. Thus, many people and/or entities rely on such tracking and tagging systems. To name a few benefits, such tagging system reduces operation costs or needs for manpower in tracking and tagging, increases security of the items, increases efficiency in keeping a good inventory of the items on premises, and increases reliability in the authentication of such items.

SUMMARY

Embodiments of the present invention pertain to an RFID transponder/tag for an item having a conductive layer included therein. Many items currently include a conductive layer in its label, packaging, protective cover, sealing cover, or the like. Examples of such an item may include a Blister Pack, a pharmaceutical item, a medicine bottle, an electronic item, a packaging of an item, food, toy, electronic, or non-electronic item in a package, or any other item that can incorporate es or has a conductive layer. Embodiments of the present invention leverage the conductive layer that may already currently being included with certain items to incorporate an RFID tag into the items. Some embodiments incorporate an RFID tag into an item that includes the conductive layer in which the conductive layer is configured such that it can function as an antenna for an RFID tag.

One embodiment of the invention pertains to a device that comprises a conductive layer (e.g., foil or metal) formed on a first substrate. An opening line (or two or more opening lines) is formed in the conductive layer to make the conductive layer a part of an antenna structure. An integrated circuit chip is placed over at least a portion the opening line and interconnected to the conductive layer. The device can be a Blister Pack, a bottle cap, a bottle sealing, or an object that can incorporates/includes the conductive layer.

One embodiment of the invention pertains to a method that comprises creating an opening line in a conductive layer formed on a first substrate and coupling a RFID integrated circuit chip to the conductive layer. The opening line enables the conductive layer to act as a part of an antenna structure for an RFID device. The RFID integrated circuit chip is placed over a portion of the opening line and is electrically interconnected to the conductive layer. The method enables tagging, authenticating, and/or tracking an item that includes that conductive layer and the RFID integrated circuit chip assembled according to embodiments of the present invention. An RFID tag reader is provided so that information stored in the RFID integrated circuit chip can be transferred to and from the RFID integrated circuit chip. The RFID tag reader is also provided so that the conductive layer can receive energy from the reader to provide power to the RFID integrated circuit chip so that the chip can effectuate communication between the RFID device and the RFID reader. In one embodiment, the RFID device is formed using a web process.

In one embodiment, the conductive layer acts as an antenna for an RFID device. In another embodiment, a cap layer is placed over the conductive layer and the RFID integrated circuit chip. In yet another embodiment, the integrated circuit chip is recessed into a second substrate, which is then coupled to the conductive layer such that the integrated circuit chip is interconnected to the conductive layer. The integrated circuit chip may also be recessed into the second substrate via a fluidic-self-assembly (FSA) process. The integrated circuit chip may also be recessed below a surface of the second substrate.

In some embodiments, an RFID tag is incorporated into an item that includes a conductive layer or a metalization layer that provides an electrical function for the item (e.g., as in the case of a CD or a DVID disc). The conductive layer for such item thus cannot be altered since the conductive layer needs to still perform the electrical function for the item. In such embodiments, the RFID tag is incorporated into the item using capacitive coupling to the conductive layer. One embodiment of the invention pertains to a device that comprises a metalization layer and an integrated circuit chip incorporated into the device wherein the integrated circuit chip is capacitively coupled to the metalization layer. The device comprises a first substrate having the metalization layer formed on the substrate, a cap layer covering at least the entire metalization layer and at least a portion of the substrate not covered by the metalization layer. The integrated circuit chip is coupled to the first substrate, and is placed in proximity and in non-physical contact with the metalization layer. A conductive layer is attached to the integrated circuit chip. The conductive layer has at least a portion placed in a non-physical contact with the metalization layer. The integrated circuit chip is capacitively coupled to the metalization layer through the conductive layer and the metalization layer. The integrated circuit chip is an RFID chip in one embodiment and the metalization layer acts as the antenna that is coupled to the RFID chip capacitively for an RFID system. The device can be a CD, CD-ROM, CD-R, CD-RW, CD-I, DVD, DVD-ROM, DVD-R, and DVD-RAM.

One embodiment of the invention pertains to a device that comprises a metalization layer and an integrated circuit chip incorporated into a label that is affixed to the device wherein the integrated circuit chip is capacitively coupled to the metalization layer. The device comprises a first substrate having the metalization layer formed on the substrate. A cap layer covering at least the entire metalization layer. At least a portion of the substrate is not covered by the metalization layer. The label is placed over the substrate. The integrated circuit chip is coupled to the label. The integrated circuit chip is placed in proximity and in non-physical contact with the metalization layer. A conductive layer is attached to the integrated circuit chip. The conductive layer has at least a portion placed in a non-physical contact with the metalization layer. The integrated circuit chip is capacitively coupled to the metalization layer through the conductive layer and the metalization layer. The integrated circuit chip is an RFID chip in one embodiment and the metalization layer acts as the antenna that is coupled to the RFID chip capacitively for an RFID system. The device can be a CD, CD-ROM, CD-R, CD-RW, CD-I, DVD, DVD-ROM, DVD-R, and DVD-RAM.

One embodiment of the invention pertains to a device that comprises a metalization layer and an integrated circuit chip incorporated into a center ring substrate that is affixed to the center of the device wherein the integrated circuit chip is capacitively coupled to the metalization layer. The device comprises a first substrate having the metalization layer formed on the substrate. A cap layer covers at least the entire metalization layer. At least a central portion of the substrate is not covered by the metalization layer. The center ring substrate is placed over the central portion. The center ring substrate comprises the integrated circuit chip disposed therein, a conductive layer attached to the integrated circuit chip, and may have one or more weight balancing components. The integrated circuit chip is placed such that the integrated circuit chip is in proximity and in non-physical contact with the metalization layer. The conductive layer has at least a portion placed in a non-physical contact with the metalization layer. The integrated circuit chip is capacitively or inductively coupled to the metalization layer through the conductive layer and the metalization layer. The integrated circuit chip is an RFID chip in one embodiment and the metalization layer acts as the antenna that is coupled to the RFID chip capacitively for an RFID system. The device can be a CD, CD-ROM, CD-R, CD-RW, CD-I, DVD, DVD-ROM, DVD-R, and DVD-RAM.

Other embodiments of the present invention pertain to methods which comprise providing an electronic device. The electronic device comprises a first substrate having a metalization layer formed on the substrate, a cap layer covering at least all of the metalization layer and at least a portion of the substrate is not covered by the metalization layer. The methods further comprise providing an RFID transponder, which comprises identification information for the electronic device, and providing an RFID reader receptive of the RFID transponder. The RFID transponder is incorporated into the electronic device.

The method similar to above wherein the RFID transponder includes an integrated circuit chip coupled to the first substrate and placed in proximity and in non-physical contact with the metalization layer and a conductive layer attached to the integrated circuit chip and having at least a portion placed in a non-physical contact with the metalization layer. The integrated circuit chip is capacitively or inductively coupled to the metalization layer through the conductive layer and the metalization layer.

The method similar to above wherein the RFID transponder includes a label placed over the substrate, an integrated circuit chip coupled to the label, and a conductive layer attached to the integrated circuit chip. The integrated circuit chip is placed in proximity and in non-physical contact with the metalization layer. The conductive layer has at least a portion placed in a non-physical contact with the metalization layer. The integrated circuit chip is capacitively or inductively coupled to the metalization layer through the conductive layer and the metalization layer.

The method similar to above wherein the RFID transponder at least a central portion of the substrate not covered by the metalization layer and a center ring substrate placed over the central portion. The center ring substrate comprises an integrated circuit chip disposed therein. A conductive layer is attached to the integrated circuit chip. One or more weight balancing components may be deposited on the center ring substrate. The integrated circuit chip is placed such that the integrated circuit chip is in proximity and in non-physical contact with the metalization layer. The conductive layer has at least a portion placed in a non-physical contact with the metalization layer. The integrated circuit chip is capacitively or inductively coupled to the metalization layer through the conductive layer and the metalization layer.

Other embodiments are also described herein.

DETAILED DESCRIPTION

Figures 1A, 1B:
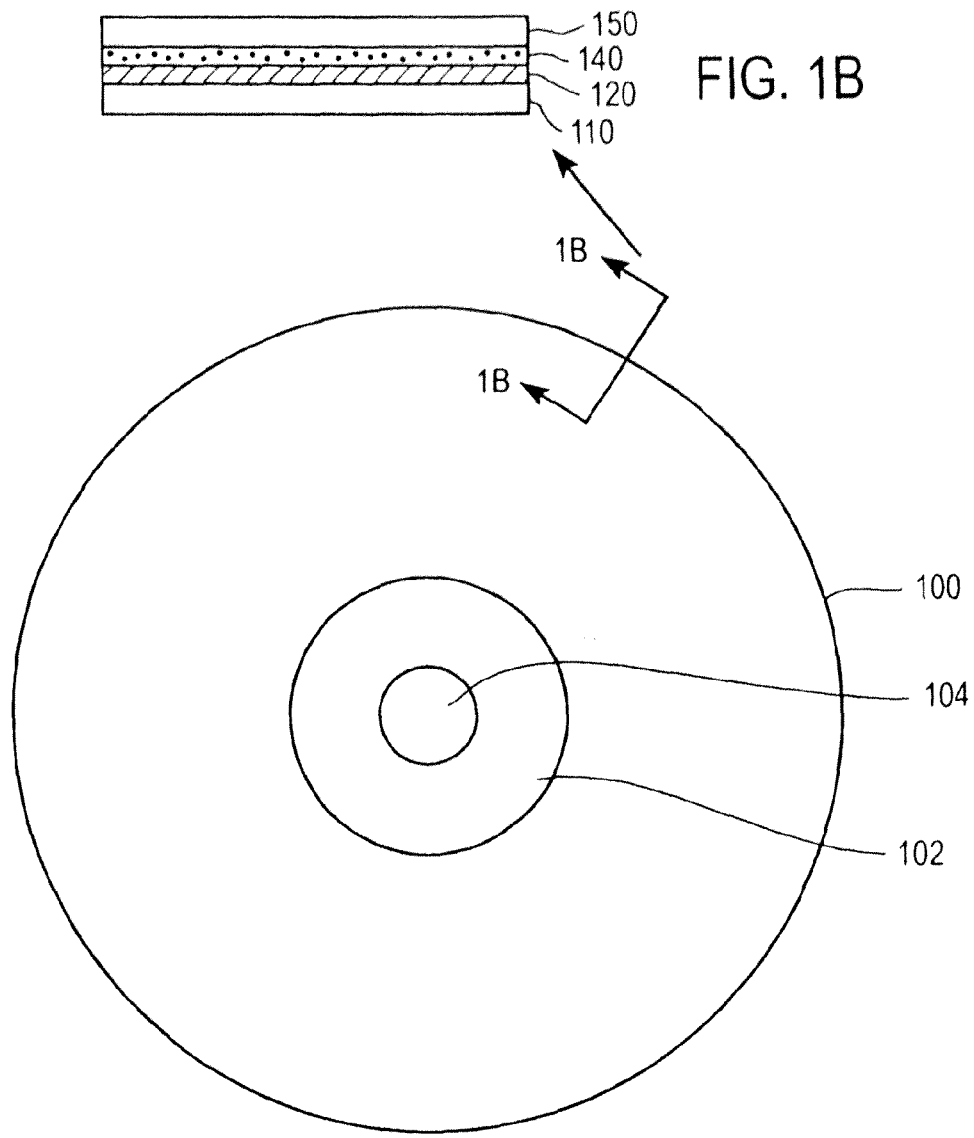
FIGS. 1A-1B illustrate an exemplary device that can incorporate an RFID transponder.

Embodiments of the present invention pertain to an RFID transponder (tag) incorporated into a device, an item, and an object, such as an electronic device, a food item, a medicine bottle, a Blister Pack, a book, or any other item that allows a conductive layer to be attached thereto or included therein. Embodiments of the present invention also pertain to methods of tagging, identifying, or authenticating a particular item using the RFID transponder that is incorporated into the item.

As mentioned above, RFID devices are currently used for remote identification of objects. The ability to remotely identify or detect an item using an RFID system is important for many purposes such as identifying/detecting an item or an object in a warehouse, retailers, stores, pharmacies, hospitals, drug stores, supermarkets, libraries, dealerships, parking lots, airports, train stations, and/or at many other locations. An RFID system needs an RFID reader and an RFID transponder (tag). An antenna is typically formed on the RFID transponder as is know in the art. Manufacturers have been unable to make or place an RFID transponder directly on a device that has a metal structure included therein because an antenna structure or loop cannot be printed on the metal and still function properly. Thus, manufacturers have been unable to incorporate a RFID transponder directly on a CD (Compact Disc), CD-ROM (Compact Disc Read Only Memory), CD-R (Compact Disc Recordable), CD-RW (Compact Disc Rewritable), CD-I (Compact Disc Interactive), DVD (Digital Video Disc or Digital Versatile Disc), DVD-ROM (Digital Video Disc Read Only), DVD-R (Digital Video Disc Recordable), and DVD-RAM (Digital Video Disc Rewritable), and other devices, electronic devices, or discs that include a metal structure. Additionally, manufacturers have been unable to incorporate an RFID transponder into a pharmaceutical packaging without substantial and costly modification (e.g., a Blister Pack or a bottle) since currently many of these pharmaceutical packaging include a conductive component. One reason that the manufacturers have been unable to incorporate a RFID transponder directly on such devices is that the antenna for the RFID transponder cannot be printed on the devices directly due to the interference by the metal structures in these devices. An antenna structure or loop gets detuned and fails to function properly when placed in closed proximity with or printed directly on a metal structure. It has been thought of that when an electrical field of any transmitter such as an antenna approaches a conductor such as a metal structure, the transmitter goes to zero at the surface of the conductor and as such, the transmitter (antenna) gets detuned.

Embodiments of the present invention overcome the problem discussed above. Embodiments of the present invention incorporate an RFID transponder directly into an electronic device that has a metal structure included therein. The RFID transponder is said to be directly incorporated into the device because the RFID transponder is not placed on a jacket, cover, or packaging of the device. Instead, the RFID transponder, after the incorporation, becomes part of the device and cannot be easily removed from the device. In one aspect, the RFID transponder is incorporated directly into the device by utilizing the metal structure of the device as an antenna for the RFID transponder. The RFID transponder may have more than one antenna and may use more than one metal structure provided in the device for such antennas. Additionally, the metal structure of the device that is utilized as the antenna for the RFID transponder is capacitively or inductively coupled to an integrated circuit chip of the RFID transponder. The RFID transponder is formed directly on the device while utilizing an already existing metal structure on the device as an antenna structure. The normal function of the metal structure provided in the device is not affected by the coupling. Additionally, the metal structure can perform an additional function as an antenna structure for the RFID transponder. The RFID transponder of the embodiments of the present invention can work in a wide range of high frequency from low to high, including frequency ranges from about 800 MHz to 3 GHz. The RFID transponder thus allows for longer range detection.

In one embodiment, an electronic device is any one of a CD, CD-ROM, CD-R, CD-RW, CD-I, DVD, DVD-ROM, DVD-R, or DVD-RAM. An RFID transponder is incorporated directly on the device utilizing metalization layer provided in each of these devices as the antenna for the RFID transponder. The metalization layer thus, besides performing other purposes for the device, also acts as the antenna for the RFID transponder. The RFID transponder includes an integrated circuit, typically an RFID integrated circuit (RFID IC) chip coupled to the device. The RFID IC chip is capacitively or inductively coupled to the metalization layer. The RFID IC chip is placed at a predetermined distance (e.g., between about 0-3 mm) away from the metalization layer of the device so that it is in a non-physical contact with the metalization layer. The RFID IC chip may be first incorporated into a strap which is then coupled to the surface of the device. The RFID IC chip is placed sufficiently close to the metalization layer such that energies can easily be transferred between the RFID IC chip and the metalization layer to form the RFID transponder. This is referred to as coupling in the embodiments of the present invention.

FIGS. 1A-1B illustrates an electronic device 100 that can benefit from an RFID transponder (tag) formed in accordance to some embodiments of the present invention. The electronic device 100 an be a CD, CD-ROM, CD-R, CD-RW, CD-I, DVD, DVD-ROM, DVD-R, and DVD-RAM as shown in FIGS. 1A-1B. The device 100 includes a center portion 102 and an opening 104. The opening 104 typically allows a component from a reading machine (e.g., a CD player/recorder) to be inserted therethrough for controlling and positioning the device 100. The center portion 102 is typically a plastic area or a non conductive area of the device 100. The device 100 typically includes several important layers shown in FIG. 1B. The device 100 includes a substrate 110, which could be the same material as the center portion 102 and be made of plastic. On top of the device 100 is formed a metalization layer 120. The metalization layer 120 typically does not cover the center portion are 102 of the device 100. In one embodiment, the metalization layer includes information coded thereon using reflective and non-reflective coatings. The device 100 may also include a cap layer 140, typically a protective and non-conductive layer that also functions to protect the metalization layer 120. The cap layer 140 covers at least the entire surface of the metalization layer 120. In some embodiments, the cap layer 140 covers also the center portion 102. In other embodiments, a label 150 is also included and placed over the device 100. The label 150 typically contains visible information that identifies and provides some information about the device, such as the name of an album or a movie recorded on the device 100. The label 150 may or may not cover the entire surface of the device 100 (except the opening 104).

Figure 2:
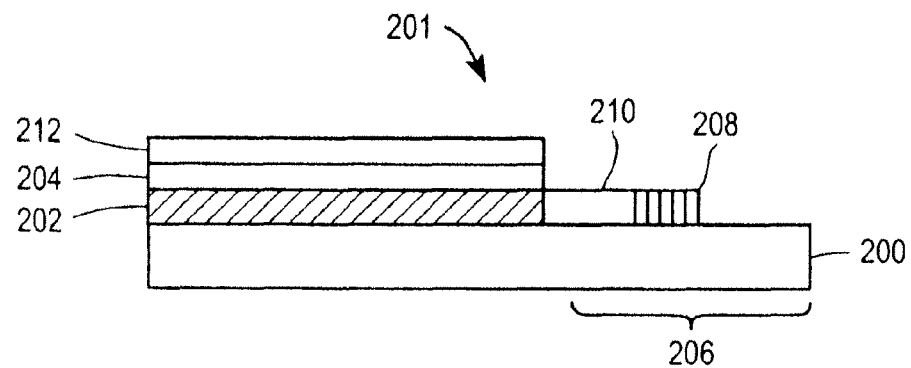
FIG. 2 illustrates an exemplary RFID transponder incorporated into a device through capacitive coupling.

FIG. 2 illustrates an embodiment of the invention that pertains to a device 201 (e.g., a CD) directly incorporates an RFID transponder on the device. The device 201 that comprises a metalization layer 202 and an integrated circuit chip 208 incorporated into the device 201 wherein the integrated circuit chip (e.g., an RFID IC chip) 208 is capacitively coupled to the metalization layer 202. The device 201 comprises a first substrate 200 having the metalization layer 202 formed on a surface of the substrate 200. A cap layer 204 covering at least the entire metalization layer 202 is also included in the device 201. The cap layer 204 may also cover the portion 206. As shown in FIG. 2, in one embodiment, at least a portion 206 of the substrate 200 is not covered by the metalization layer 202. Similar to previously shown in FIG. 1A, the device 201 may include a center portion (which could be the portion 206 shown in FIG. 2) that does not have the metalization layer 202 formed thereon. In one embodiment, a label 212 providing visual information or display for the device 201 may be included in the device 201 and is placed over the cap layer 204. The label 212 may also cover the portion 206.

Still with FIG. 2, the integrated circuit chip 208 is coupled to the first substrate 200, and is placed in proximity and in non-physical contact with the metalization layer 202. The integrated circuit chip 208 may be coupled to the portion 206, directly on the substrate 200 or on the cap layer 204 if the cap layer 204 covers the portion 206 of the substrate 200. In one embodiment, the integrated circuit chip 208 is placed at a distance between about 0 mm and about 3 mm to the metalization layer 202. The integrated circuit chip 208 is placed close enough to the metalization layer 202 for a capacitive coupling between the integrated circuit chip 208 and the metalization layer 202, but not physically touching so as to cause the RFID transponder to not work. In one embodiment, a conductive layer 210 is attached to the integrated circuit chip 208. The conductive layer 210 has at least a portion being positioned or placed in a non-physical contact with the metalization layer 202. The integrated circuit chip 208 is capacitively coupled to the metalization layer 202 through the conductive layer 210 and the metalization layer 202. The integrated circuit chip is an RFID chip, in one embodiment, and the metalization layer 202 acts as an antenna that is coupled to the RFID chip 208 capacitively for an RFID transponder. The device can be a CD, CD-ROM, CD-R, CD-RW, CD-I, DVD, DVD-ROM, DVD-R, and DVD-RAM.

The integrated circuit chip 208 may be deposited in a second substrate 300 (FIG. 3), which is then coupled to the first substrate 200. The second substrate 300 can be a plastic film, plastic sheet, or other suitable materials. The integrated circuit chip 208 may be a functional block 304 having a top surface 304-T upon which a circuit element is situated (not shown). The circuit element on the top surface may be an ordinary integrated circuit (IC) for any particular function. The IC may be designed to receive power from another circuit for the operation of an RFID transponder. The IC may also be designed to receive power from an energy source (e.g. battery) for the operation of the RFID tag. In one embodiment, the functional block 304 has a trapezoidal cross-section where the top of the block 304 is wider than the bottom of the block 304. The functional block 304 may also have other suitable/desired shapes. The functional block 304 may be created from a host substrate and separated from this substrate. Methods of such a functional block 304 are known in the art. The functional block 304 may be a NanoBlock™, which is a trademark of Alien Technology Corporation, Morgan Hill, Calif.

In one embodiment, the functional block 304 is placed in the second substrate 300 (FIG. 3) using a Fluidic Self-Assembly (FSA) process. Of course, other placement methods can be used. In one embodiment, the second substrate 300 includes a receptor 302 configured to receive the functional block 304. The receptor 302 may be a recessed region formed into the second substrate 300. In the embodiment where the functional block 304 has the trapezoidal shape, the receptor 302 has a similar shape and/or size so that the block 304 can be deposited therein. The receptor 302 thus is configured with a complimentary shape for the particular shape of the functional block 304 in one embodiment. In an alternative embodiment, the functional block 304 may be pressed, recessed, or otherwise placed onto the substrate using suitable methods. The substrate 300 thus needs not have the receptor 302 formed so that the block 304 can be deposited therein. Instead, the block 304 can be pressed into the substrate 300.

The functional block 304 may be deposited into the receptor 302 by an FSA method described in U.S. Pat. No. 5,545, 291 which is hereby incorporated by its reference in its entirety. In one embodiment, the functional block 304 is recessed within the second substrate 300 or placed below or at a surface 300-S of the second substrate 300. The FSA process may be performed with a web material in which a web material for the second substrate 300 is provided. The web may contain a plurality of receptors 302. The web material is advanced through a web process apparatus. A slurry solution (e.g., an FSA slurry) containing a plurality of functional blocks 304 is dispensed over web material. The blocks 304 would then fall into receptors 302 formed on the web material. The web material can then be sliced, singulated, separated so to form a plurality of substrates 300 each comprising one or more functional blocks 304.

Figure 3:
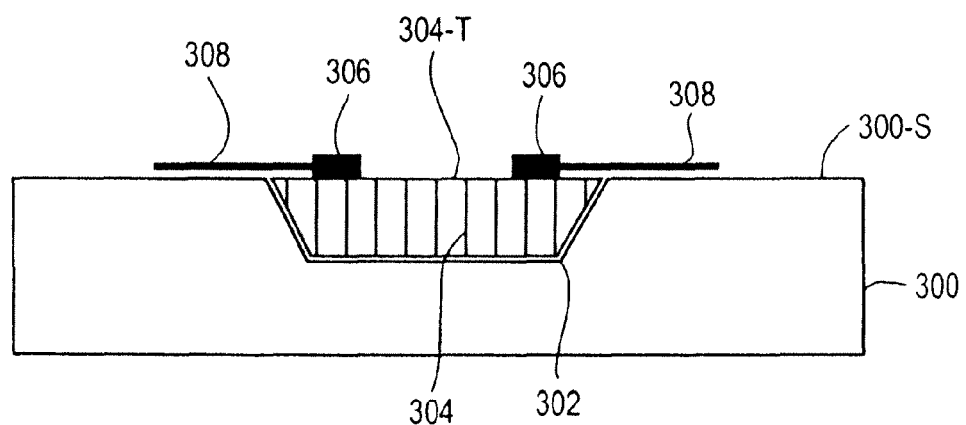
FIG. 3 illustrates an exemplary RFID circuit chip in the form of a functional block.

In one embodiment, the functional block 304 includes one or more contact pads 306 so that conductive elements can be connected to the functional block 304. Multiple contact pads may be included so that the functional block 304 can be coupled to more that one antennas or other devices. The contact pads 306 can be formed on top of the functional block 304. As shown in FIG. 3, a conductive layer 308 is connected to the contact pads 306. In one embodiment, an insulation layer (not shown) such as a planarization layer may be included on top of the functional block 304 that has been deposited in the receptor 302. The insulation layer may provide a flat surface to the second substrate 300 as well as insulate certain components on top of the functional block 304. The insulation layer may include one to more vias (not shown) created therethrough. Electrical interconnection to the contact pads 306 would be established through the vias. Forming the insulation layer and the vias are well known in the art and can be done by methods including laser drilling or photolithographic etching. The conductive layer 308 can be formed of a suitable conductors and can include metallic films, conductive polymers, or inks filled with conductive particles. The conductive layer 308 can be formed by a method such as a subtractive process (using etching/lithography or laser ablation) on a metal film, or an additive process (such as printing) metal traces.

In one embodiment, the conductive layer 308 is a conductive trace that extends from the functional block 304. For instance, the contact pads 306 may be extended so that it also forms the conductive layer 308. The contact pads 306 may also be integral parts of the conductive layer 308. In one embodiment, the conductive layer 308 acts to enhance resonance for the RFID transponder or acts as a resonator for the RFID transponder.

Figure 4:
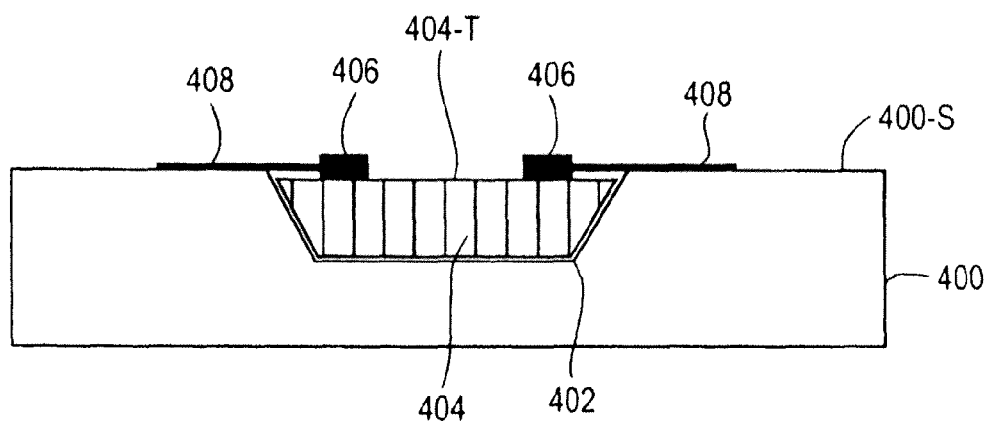
FIG. 4 illustrates another exemplary RFID circuit chip in the form of a functional block.

FIG. 4 illustrates an embodiment where the integrated circuit chip 208 is incorporated into a second substrate 400 and recessed below a surface 400-S of the substrate 400. The structure in FIG. 4 is similar to and is made similarly to the structure in FIG. 3 in all aspects except that the structure in FIG. 4 shows a functional block 404 recessed below the surface 400-S. Thus, the second substrate 400 includes a receptor 402 having the functional block 404 deposited therein as previously described. The functional block 404 includes contact pads 406 formed on a surface 404-T of the block 404, in one embodiment. A conductive layer 408 is coupled to the contact pads 406 such that electrical interconnection can be established to the functional block 404.

In one embodiment, the conductive layer 408 is a conductive trace that extends from the functional block 404. For instance, the contact pads 406 may be extended so that it also forms the conductive layer 408. The contact pads 406 may also be integral parts of the conductive layer 408. In one embodiment, the conductive layer 408 acts to enhance resonance for the RFID transponder or acts as a resonator for the RFID transponder.

In one embodiment, an insulation layer (not shown) such as a planarization layer may be included on top of the functional block 404 that has been deposited in the receptor 402. The insulation layer may provide a flat surface to the second substrate 400 as well as insulate certain components on top of the functional block 404. The insulation layer is particularly helpful to provide a flat and even surface since the functional block 404 is recessed below the surface 400-S of the second substrate 400. The insulation layer may include one to more vias (not shown) created therethrough. Electrical interconnection to the contact pads 406 would be established through the vias.

Figure 5:
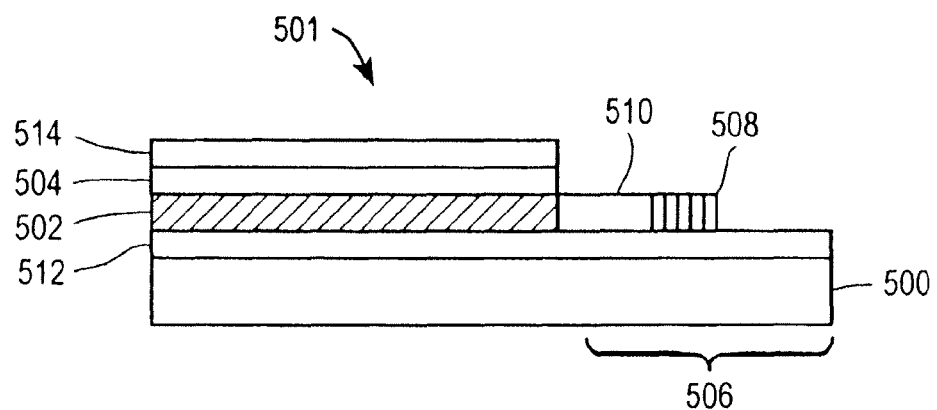
FIG. 5 illustrates an exemplary RFID transponder incorporated into a device through capacitive coupling.

In a particular device, a metalization layer such as the metalization layer 202 may be formed on a non-conductive or insulation layer. FIG. 5 illustrates such an embodiment. In FIG. 5, a device 501 similar to the device 201 includes a non-conductive layer 512 on a substrate 500 upon which a metalization layer 502 is formed. The metalization layer 502 is formed on the non-conductive layer 512. The non-conductive layer 512 may cover the entire surface of the substrate 500, or not. In one embodiment, the metalization layer 502 is not formed over all of the surface of the substrate 500 or the non-conductive layer 512 such that a portion 506 having no metalization layer 502 is provided for the device 501. As before, a cap layer 504 is provided and formed over the metalization layer 502 and may also be formed over the portion 506. Additionally, a label 514 providing visual information or display for the device 501 may be included in the device 501 and is placed over the cap layer 504 and may also be placed over the portion 506.

An RFID integrated circuit chip 508 similar to previously described (e.g., RFID integrated circuit chip 208) may be coupled to the device 501 as shown in FIG. 5 or as previously described. As illustrated, the integrated circuit chip 508 includes a conductive layer 510 that has a portion that is in a non-physical contact with the metalization layer 502. As before, the RFID integrated circuit chip 508 is placed in a close proximity but in a non-physical contact with the metalization layer 502. As shown in FIG. 5, the RFID integrated circuit chip 508 is placed in the portion 506 that does not include any metalization layer 502. A portion of the conductive layer 510 may very well be placed in a physical contact with the metalization layer 502. As before, the RFID integrated circuit chip 508 is capacitively coupled to the metalization layer 502 such that the metalization 502 acts as an antenna for an RFID transponder for the device 501. The RFID integrated circuit chip 508 may be deposited in a second substrate which is then adhered to the first substrate 500 as previously discussed.

The conductive layer that is coupled to the RFID integrated circuit chip acts as a coupler for the transponder. The conductive layer provides additional surface area for the RFID integrated circuit chip so that the metalization layer can capacitively or inductively couple to the RFID integrated circuit chip. The conductive layer for the RFID transponder may have any configuration. The conductive layer may also act as a resonator for the RFID transponder. The conductive layer may be of a straight, curved, circular, loop, dipole structure, folded, or folded-dipole structure, for examples.

Figure 6:
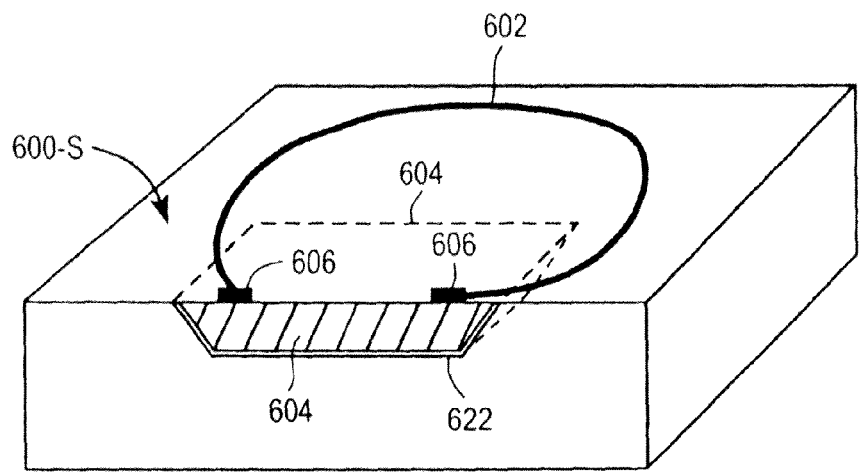
FIGS. 6-12 illustrate exemplary configurations of a conductive layer coupled to an RFID circuit chip.

FIGS. 6-12 illustrate a few of the exemplary configurations for the conductive layers (e.g., 210, 308, 408, and 510) that are coupled to, attached to, or formed on the RFID integrated circuit chip. FIG. 6 illustrates a conductive layer 602 having a loop configuration or circular configuration. The conductive layer 602 is coupled to contact pads 606 that are formed on an RFID integrated circuit chip 604. As illustrated, the RFID integrated circuit chip 604 is deposited in a receptor 622 that is formed on a substrate 600. The conductive layer 602 is formed on a surface 600-S of the substrate 600 and connected to the RFID integrated circuit chip 604 through the contact pads 606. In one embodiment, the substrate 600 having the RFID integrated circuit chip 602 deposited therein and the conductive layer 602 formed thereon is placed on a substrate portion of a device (such as portions 206 and 506). The substrate 600 is placed on the portion that does not comprise a metal structure or a metalization layer as previously discussed. The conductive layer 602 may be partially touching the metalization layer of the device but will have a portion that is not in physical contact with the metalization layer of the device.

Figure 7:
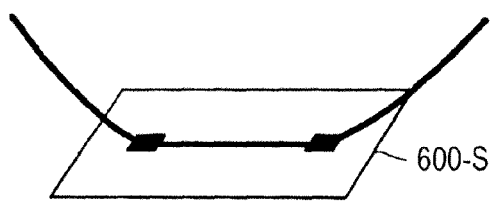
Figure 8:
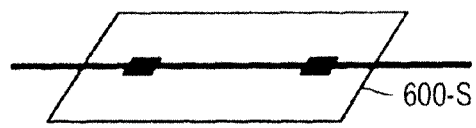
Figure 9:
Figure 10:
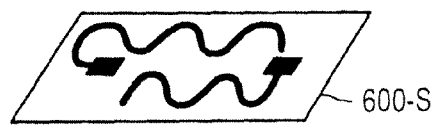
Figure 11:
Figure 12:

FIG. 7 illustrates a conductive layer 702 with a curved configuration. FIG. 8 illustrates a conductive layer 802 with a straight configuration. FIG. 9 illustrates a conductive layer 902 with a dipole structure configuration. FIG. 10 illustrates a conductive layer 1002 with a folded dipole configuration. FIG. 11 illustrates a conductive layer 1102 with a curved dipole configuration. FIG. 12 illustrates a conductive layer 1202 with another example of a curved dipole configuration. It will be apparent to those skilled in the art that other structures for the conductive layer might be possible.

Figure 13:
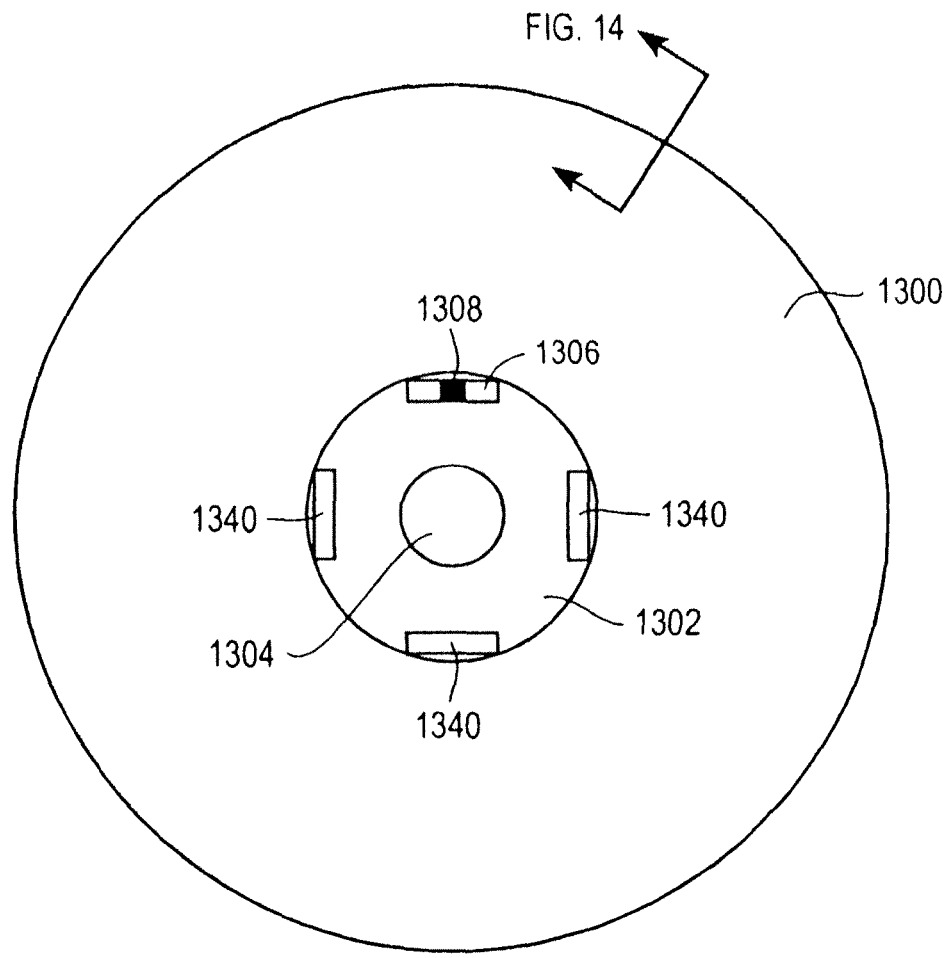
FIGS. 13-14 illustrate an exemplary device that directly incorporates an RFID transponder.
Figure 14:
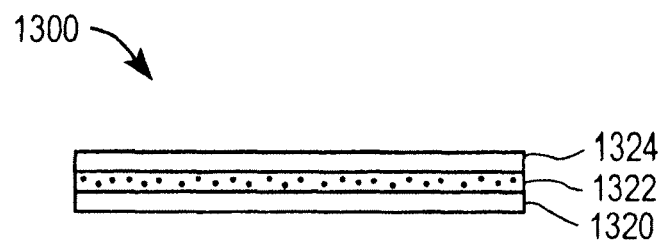

FIGS. 13-14 illustrate an exemplary embodiment where an RFID transponder 1306 is directly incorporated into an electronic device such as a CD 1300. In the present embodiment, the CD 1300 includes a center portion 1302 with no conductive material or no metalization layer. The CD 1300 also includes an opening 1304. FIG. 14 illustrates a cross section of the CD 1300 which includes a substrate 1320 which may be made of a plastic material. On the substrate 1320, a metalization layer 1322 is formed. The metalization layer 1322 is coded with information stored on the CD 1300 using methods known in the art. The CD 1300 also includes a cap layer 1324 covering at least all of the metalization layer 1322. The metalization layer 1322 is not formed over the center portion 1302 of the CD 1300. The RFID transponder 1306 can be formed as previously described. In one embodiment, the RFID transponder 1306 includes a second substrate having an RFID IC chip 1308 deposited therein as previously described.

In the present embodiment, the RFID transponder 1306 is placed mostly on the center portion 1302. The RFID transponder 1306 may be placed near the edge of the center portion 1302 as shown in FIG. 13. The RFID transponder 1306 can be adhered to the center portion 1302 using adhesive. Other techniques of coupling the RFID transponder 1306 to the CD 1300 might be possible. The RFID transponder 1306 is placed so that the RFID IC chip 1308 is not placed over any part of the CD 1300 that comprises the metalization layer 1322. Portion of the second substrate of the RFID transponder 1306 can touch or can be in a physical contact or overlap with a part of the CD 1300 that comprises the metalization layer 1322 without affecting the function of the RFID transponder 1306 so long as the RFID IC chip 1308 is not physically contacting the metalization layer 1322. The RFID IC chip 1308 is only capacitively coupled to the metalization layer 1322 of the CD 1300. The RFID transponder 1306 utilizes the metalization layer 1322 of the CD 1300 as an antenna for the RFID transponder 1306.

In one embodiment, the CD 1300 is balanced with one or more weight balancing components 1340. For a device such as a CD or a DVD to work well, the weight of the device must be balanced to allow the device to spin at high speeds. The weight balancing components 1340 may be structures that have similar weights as the RFID transponder 1306. The weight of the weight balancing components 1340 though need not match the weight of the RFID transponder 1306 for the CD 1300 to be well balanced. The weight balancing components 1340 may be placed along the center portion 1302 in a predetermined fashion so as to achieve balance spinning weight for the CD 1300. In some embodiments, the RFID IC chip 1308 may be created so small and/or thin that balancing may not be necessary.

In one embodiment, a label, not shown may be placed over the entire surface of the CD 1300 after the RFID transponder 1306 is incorporated into the CD 1300. The label may cover all areas of the CD 1300 except for the opening 1304. A label for a device such as the CD 1300 is well known in the art. In some embodiments, the label may be the layer that includes the desired weight balancing components 1340 such that when the label is placed over the CD 1300, the weight would be balanced.

Figure 15:
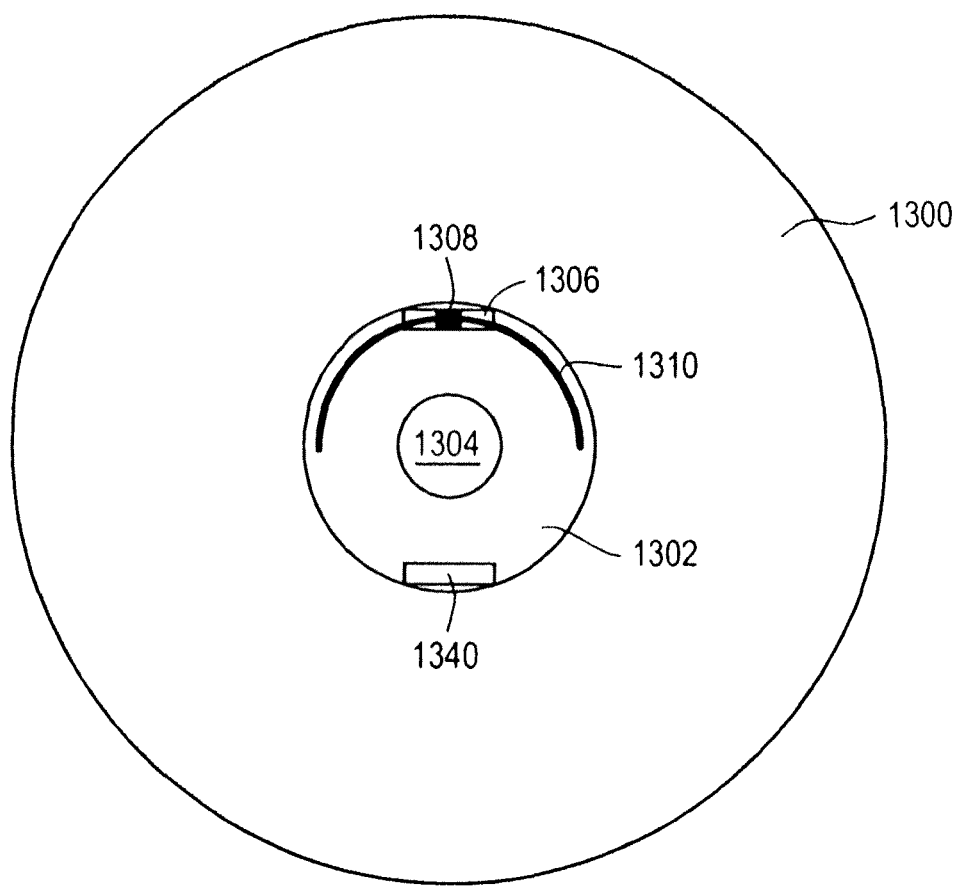
FIGS. 15-23 illustrate other exemplary devices that directly incorporates an RFID transponder.

FIG. 15 illustrates another exemplary embodiment where an RFID transponder 1306 is incorporated into an electronic device such as a CD 1300. The embodiment in FIG. 15 is similar to the embodiment show in FIG. 13 above in all aspects. In addition, in this embodiment, the RFID transponder 1306 includes a conductive layer 1310 which acts as a coupler or coupling extension for the RFID transponder 1306 that provides an extension for the RFID transponder IC chip 1308 so that the RFID IC chip 1308 can be capacitively coupled to the metalization layer 1322 of the CD 1300. The conductive layer 1310 can be formed on the second substrate of the RFID transponder 1306 as previously described. Alternatively, the conductive layer 1310 can be formed or molded into the CD 1300 along an area of the center portion 1302. When the RFID transponder 1306 is coupled or adhered to the CD 1300, the conductive layer 1310 is electrical interconnected to the RFID IC chip 1308. For instance, the RFID IC chip 1308 may include contact pads (not shown) such that when the RFID transponder 1306 is coupled or embedded into the CD 1300, the conductive layer 1310 will be in a physical contact with the contact pads.

As shown here, the conductive layer 1310 is placed on the CD 1300 such that at least a portion of the conductive layer 1310 is not in a physical contact with the metalization layer.

As before, in one embodiment, the CD 1300 is balanced with one or more weight balancing components 1340. The weight balancing components 1340 may be placed along the center portion 1302 in a predetermined fashion so as to achieve balance spinning weight for the CD 1300. A label, not shown may be also placed over the entire surface of the CD 1300 after the RFID transponder 1306 is incorporated into the CD 1300 and the conductive layer 1310 establishing the contact with the RFID IC chip 1308. The label may cover all areas of the CD 1300 except for the opening 1304. The label may also include the weight balancing components 1340 as previously discussed.

Figure 16:
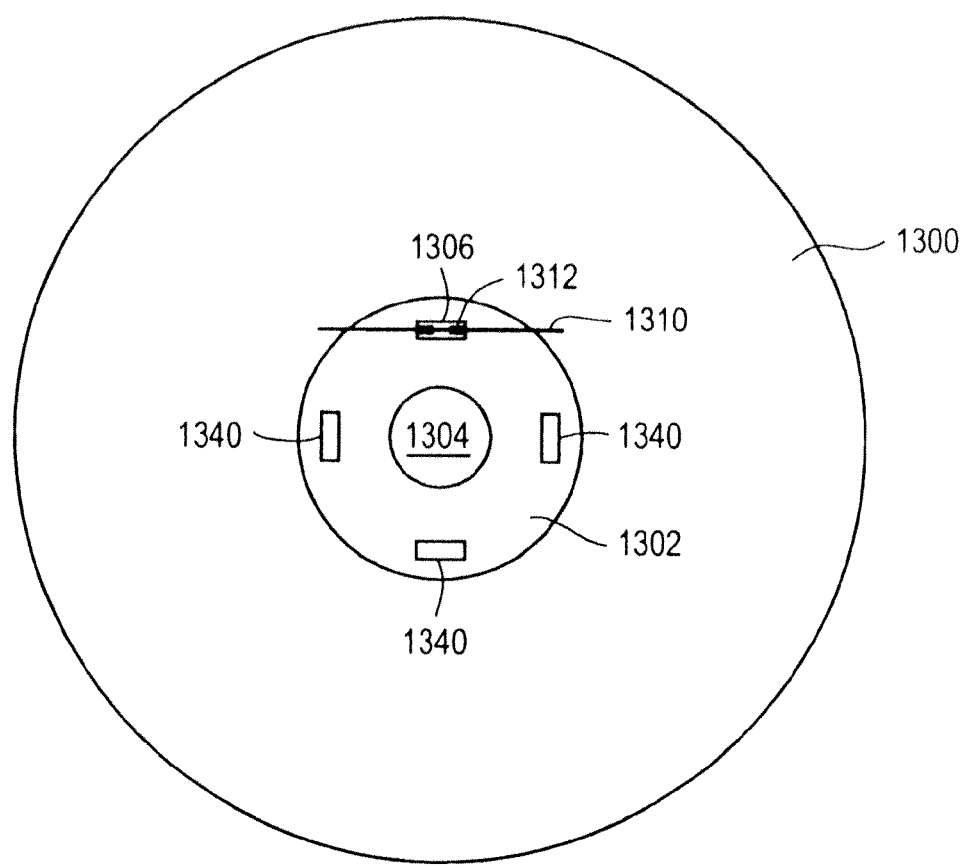

FIG. 16 illustrates another exemplary embodiment where an RFID transponder 1306 is incorporated into an electronic device such as a CD 1300. The embodiment in FIG. 16 is similar to the embodiment show in FIG. 13 or 15 above in all aspects. In addition, in this embodiment, the RFID transponder 1306 includes a conductive layer 1310 which acts as a coupler for the RFID transponder 1306 that provides an extension for the RFID transponder IC chip 1308 so that the RFID IC chip 1308 can easily be capacitively coupled to the metalization layer 1322 of the CD 1300. The conductive layer 1310 shown in FIG. 16 has a straight configuration and includes an area that is in physical contact with a portion of the CD that comprises the metalization layer 1322. The conductive layer 1310 has a portion that is not in a physical contact with the metalization layer. The conductive layer 1310 can be formed on the second substrate of the RFID transponder 1306 as previously described. As shown in FIG. 16, the RFID IC chip 1308 includes contact pads 1312 that interconnect to the conductive layer 1310.

As before, in one embodiment, the CD 1300 is balanced with one or more weight balancing components 1340 which may be placed in locations that will balance the weight for the CD 1300. A label, not shown may be also placed over the entire surface of the CD 1300 after the RFID transponder 1306 is incorporated into the CD 1300 and the conductive layer 1310 establishing the contact with the RFID IC chip 1308. The label may cover all areas of the CD 1300 except for the opening 1304. The label may also include the weight balancing components 1340 as previously discussed.

Figure 17:
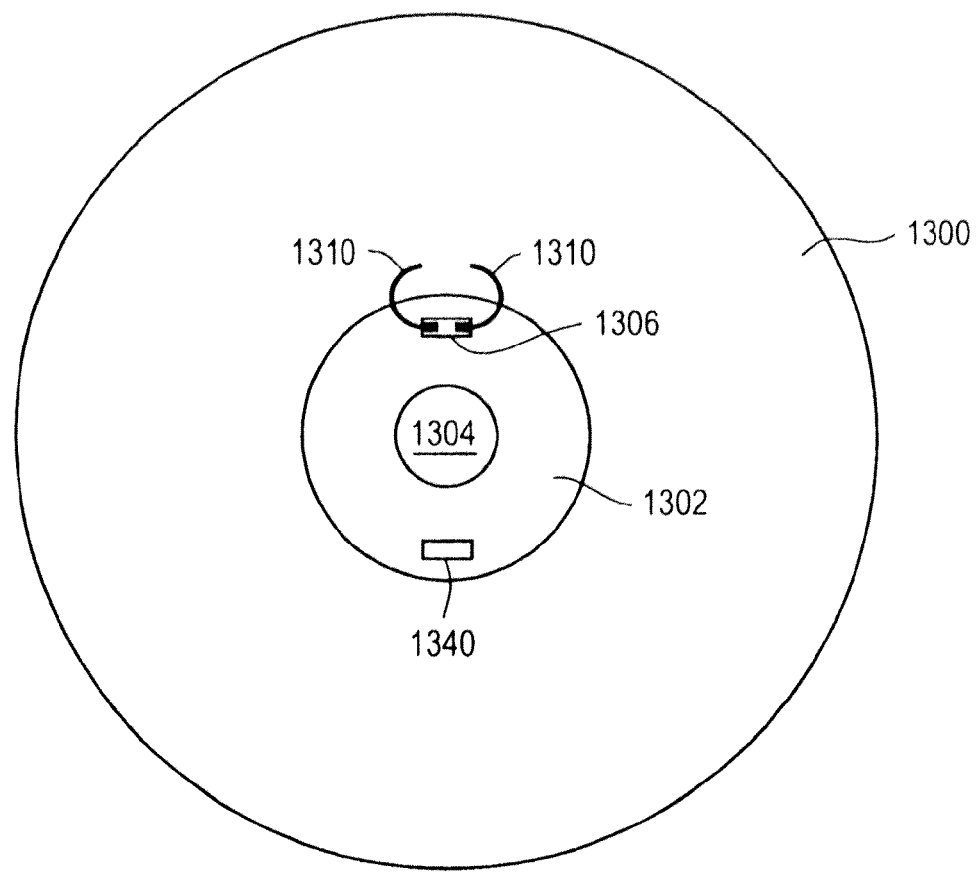

FIG. 17 illustrates another exemplary embodiment where an RFID transponder 1306 is incorporated into an electronic device such as a CD 1300. The embodiment in FIG. 17 is similar to the embodiment show in FIG. 13, 15, or 16 above in all aspects. In addition, in this embodiment, the RFID transponder 1306 includes a conductive layer 1310 which acts as a coupler for the RFID transponder 1306 that provides an extension for the RFID transponder IC chip 1308 so that the RFID IC chip 1308 can easily be capacitively coupled to the metalization layer 1322 of the CD 1300. The conductive layer 1310 shown in FIG. 17 has a dipole and loop configuration and includes an area that is in physical contact with a portion of the CD that comprises the metalization layer 1322. The conductive layer 1310 has a portion that is not in a physical contact with the metalization layer. The conductive layer 1310 can be formed on the second substrate of the RFID transponder 1306 as previously described.

As before, in one embodiment, the CD 1300 is balanced with one or more weight balancing components 1340 which may be placed in locations that will balance the weight for the CD 1300. A label, not shown may be also placed over the entire surface of the CD 1300 after the RFID transponder 1306 is incorporated into the CD 1300 and the conductive layer 1310 establishing the contact with the RFID IC chip 1308. The label may cover all areas of the CD 1300 except for the opening 1304. The label may also include the weight balancing components 1340 as previously discussed.

Figure 18:
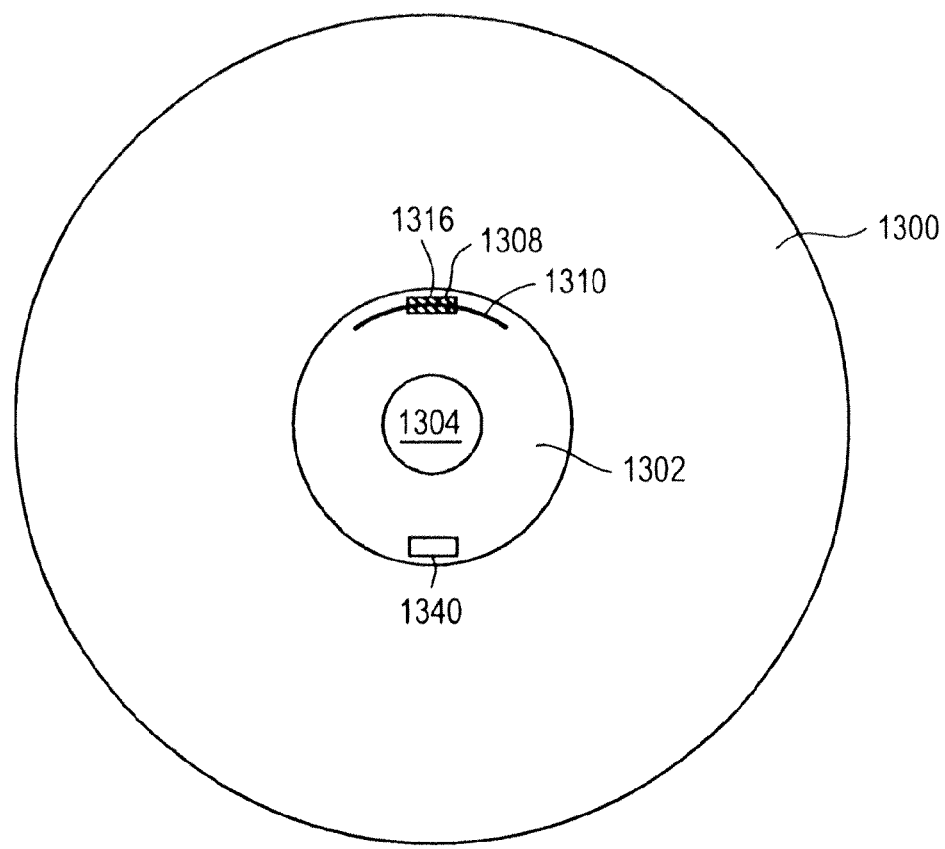

FIG. 18 illustrates an exemplary embodiment where an RFID transponder 1316 is incorporated directly into an electronic device such as a CD 1300. In the present embodiment, the CD 1300 includes a center portion 1302 with no conductive material or no metalization layer. The RFID transponder 1316 is formed on the center portion 1302. The CD 1300 also includes an opening 1304. FIG. 14 illustrates a cross section of the CD 1300 which includes a substrate 1320 which may be made of a plastic material. On the substrate 1320, a metalization layer 1322 is formed. The metalization layer 1322 is coded with information stored on the CD 1300 using methods known in the art. The CD 1300 also includes a cap layer 1324 covering at least all of the metalization layer 1322. The metalization layer 1322 is not formed over the center portion 1302 of the CD 1300.

In the present embodiment, to form the RFID transponder 1316, an RFID IC chip 1308 is molded, embedded, placed, coupled, or otherwise adhered to the center portion 1302. Adhesive may be used to coupled the RFID IC chip 1308 to the center portion 1302. Other techniques of coupling the RFID IC chip 1308 to the CD 1300 might be possible. The RFID IC chip 1308 is not placed over any part of the CD 1300 that comprises the metalization layer 1322. The RFID IC chip 1308 is placed at a predetermined distance (e.g., between about 0.3 mm) away from the area that comprises the metalization layer 1322. A conductive layer 1310 is interconnected to the RFID IC chip 1308, in one embodiment, connected to contact pads (not shown) formed on the RFID IC chip 1308. In the present embodiment, the conductive layer 1310 is formed directly on the center portion 1302. The conductive layer 1310 may be embedded, placed, coupled, or otherwise adhered to the center portion 1302. At least some portions of the conductive layer 1310 are not in a physical contact with or overlap with a part of the CD 1300 that comprises the metalization layer 1322. The RFID IC chip 1308 is only capacitively coupled to the metalization layer 1322 of the CD 1300 via the conductive layer 1310. As before, the RFID transponder 1316 utilizes the metalization layer 1322 of the CD 1300 as the antenna for the RFID transponder 1316.

In one embodiment, the CD 1300 is balanced with one or more weight balancing components 1340. The weight balancing components 1340 may be placed along the center portion 1302 in a predetermined fashion so as to achieve balance spinning weight for the CD 1300. In one embodiment, a label, not shown may be placed over the entire surface of the CD 1300 after the RFID transponder 1316 is formed on the CD 1300. The label may cover all areas of the CD 1300 except for the opening 1304. The label may also include the weight balancing components 1340 as previously mentioned.

Figure 19:
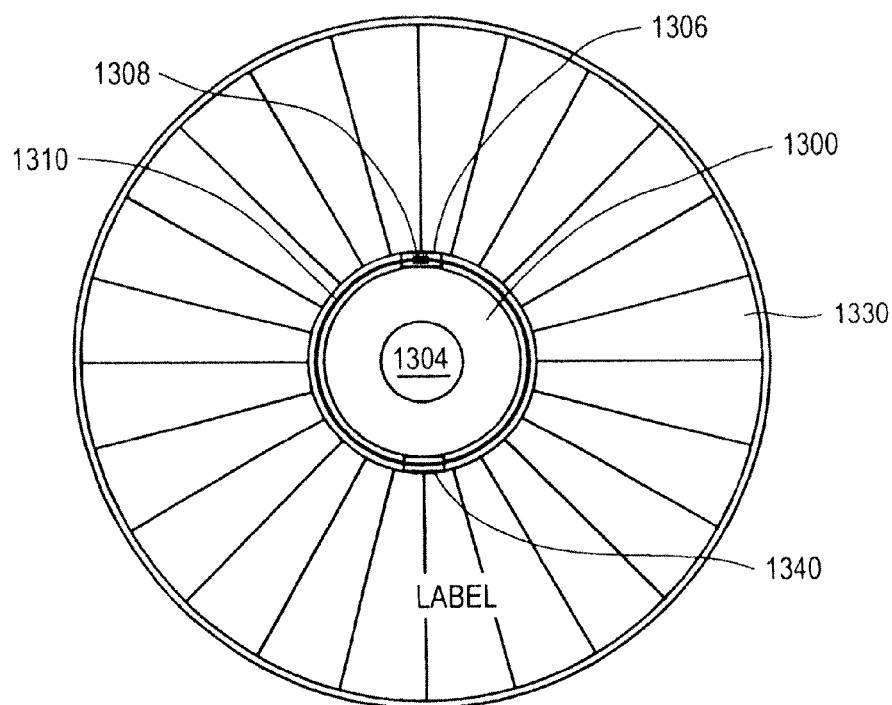
Figure 20:
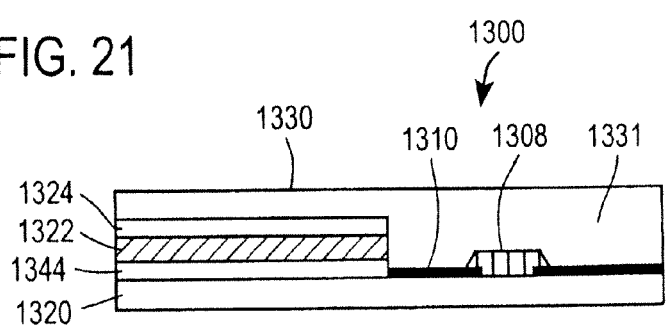

FIGS. 19-20 illustrate an exemplary embodiment where an RFID transponder 1306 is directly incorporated into an electronic device such as a CD 1300. In the present embodiment, the CD 1300 includes a center portion 1302 with no conductive material or no metalization layer. The CD 1300 also includes an opening 1304. FIG. 20 illustrates a cross section of the CD 1300 which includes a substrate 1320 which may be made of a plastic material. Optionally, on the substrate 1320, a non-conductive layer 1344 is provided. On the substrate 1320 (or on the non-conductive layer 1344), a metalization layer 1322 is formed. The metalization layer 1322 is coded with information stored on the CD 1300 using methods known in the art. The CD 1300 also includes a cap layer 1324 covering at least all of the metalization layer 1322. The metalization layer 1322 is not formed over the center portion 1302 of the CD 1300.

In one embodiment, an RFID transponder 1306 is formed on or included into a label 1330 of the CD 1300 (FIG. 20). In the present embodiment, an RFID IC chip 1308 is embedded into the label 1330 using methods known in the art (e.g., FSA). The chip 1308 may also be placed into the label 1330 using other methods. The label 1330 may be a second substrate as previously described and include a receptor configured to receive the chip 1308. The chip 1308 may also be adhered to the label 1330 using a convenient technique such as using adhesive. A conductive layer 1310 is then formed on the label 1130 and interconnected to the chip 1308. The chip 1308 may include contact pads (not shown) that the conductive layer 1310 is connected to. A planarization layer (not shown) may be placed over the side label 1330 to provide a smooth surface and a protective layer for the chip 1308. In an alternative embodiment, the conductive layer 1310 is formed on the CD 1300 and is connected to the chip 1308 when the label 1330 is placed over the CD 1300. The label 1330 is then placed over the CD 1300. The label 1330 has a portion 1331 that overlaps with the center portion 1302 when the label 1330 is placed over the CD 1300. The chip 1308 and portions of the conductive layer 1310 is formed in the portion 1331 such that when the label 1330 is placed over the CD 1300, the chip 1308 is not in a physical contact with a part of the CD that comprises the metalization layer 1322. Additionally, when the label 1330 is placed over the CD 1300, a portion of the conductive layer 1310 is also not in a physical contact with the part of the CD that comprises the metalization layer 1322. In one embodiment, the conductive layer 1310 has a circular configuration and does not have a part that overlaps the part of the CD that comprises the metalization layer 1322. The RFID transponder 1306 forms a capacitive coupling to the metalization layer 1322 utilizing the metalization layer 1322 as an antenna layer.

Figure 21:
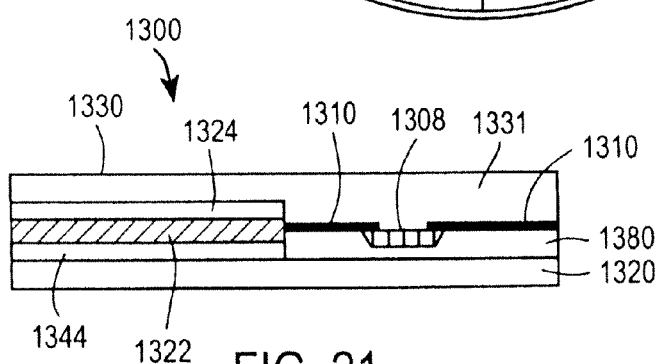

In one embodiment, the RFID transponder 1306 can be formed as previously described and then laminated or otherwise coupled to the label 1330 (FIG. 21). In the present embodiment, the RFID transponder 1306 includes a second substrate 1380 having an RFID IC chip 1308 deposited therein. The RFID transponder 1306 also includes a conductive layer 1310 formed on the second substrate 1380. The second substrate 1380 with all the necessary components is then laminated or adhered to the label 1330 as shown in FIG. 21. The label 1330 is then placed over the CD 1300. The label 1330 has a portion 1331 that overlaps with the center portion 1302 when the label 1330 is placed over the CD 1300. The RFID transponder 1306 is laminated or adhered to the portion 1331 such that when the label 1330 is placed over the CD 1300, the chip 1308 is not in a physical contact with a part of the CD that comprises the metalization layer 1322. Additionally, when the label 1330 is placed over the CD 1300, a portion of the conductive layer 1310 is also not in a physical contact with the part of the CD that comprises the metalization layer 1322. In one embodiment, the conductive layer 1310 has a circular configuration and does not have a part that overlaps the part of the CD that comprises the metalization layer 1322. The RFID transponder 1306 forms a capacitive coupling to the metalization layer 1322 utilizing the metalization layer 1322 as an antenna layer.

In one embodiment, the CD 1300 is balanced with one or more weight balancing components 1340 as previously mentioned. The weight balancing components 1340 may be placed on the label 1330, for example, along the portion 1331 of the label 1330. Alternatively, the weight balancing components 1340 may be placed along the center portion 1302 in a predetermined fashion so as to achieve balance spinning weight for the CD 1300 after the label 1300 is affixed thereto.

Figure 22:
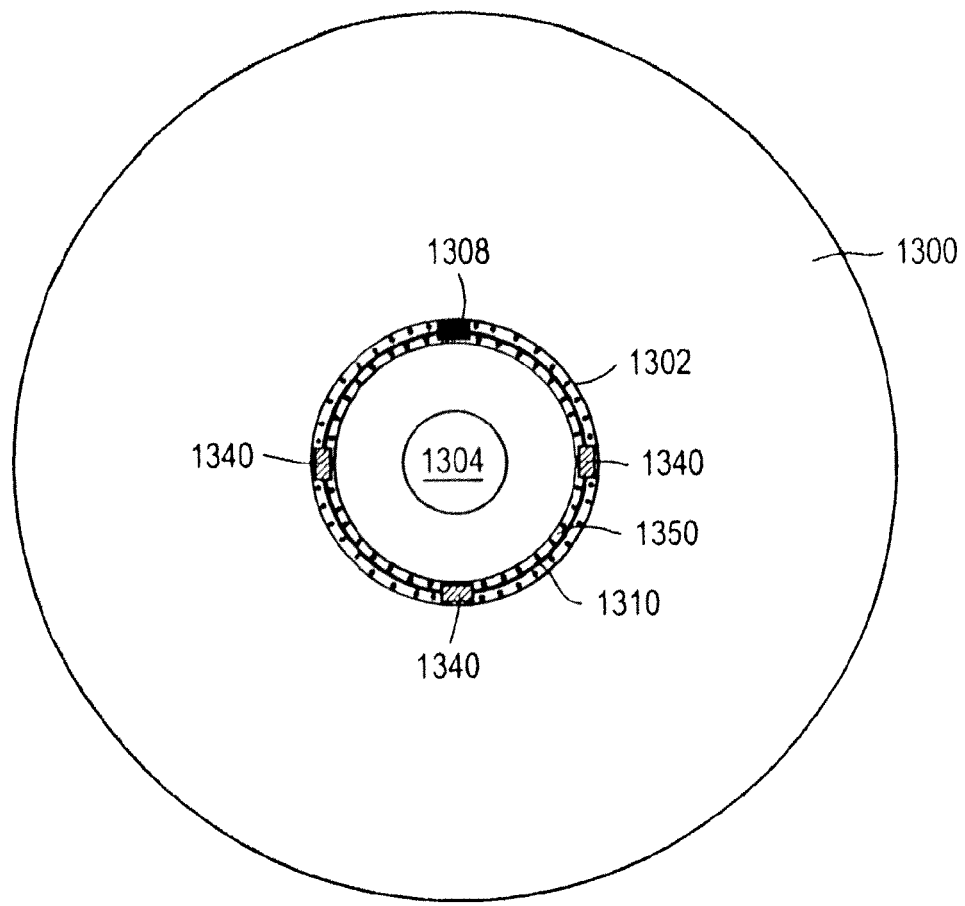
Figure 23:
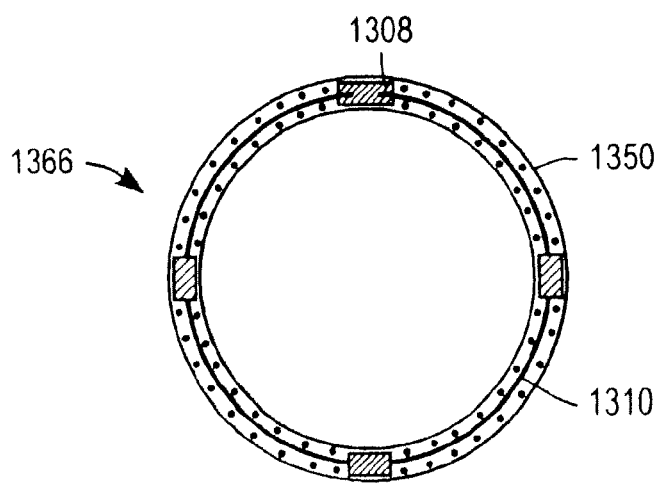

FIGS. 22-23 illustrate an exemplary embodiment where an RFID transponder 1366 is incorporated into an electronic device such as a CD 1300. In the present embodiment, the CD 1300 includes a center portion 1302 with no conductive material or no metalization layer. The CD 1300 also includes an opening 1304. FIG. 4 illustrates a cross section of the CD 1300 which includes a substrate 1320 which may be made of a plastic material. On the substrate 1320, a metalization layer 1322 is formed. The metalization layer 1322 is coded with information stored on the CD 1300 using methods known in the art. The CD 1300 also includes a cap layer 1324 covering at least all of the metalization layer 1322. The metalization layer 1322 is not formed over the center portion 1302 of the CD 1300.

As illustrated in FIG. 23, in one embodiment, an RFID transponder 1366 includes a center ring structure or substrate 1350 which is placed on the center portion 1302 of the CD 1300. The center ring structure 1350 includes an RFID IC chip 1305 incorporated therein. In the present embodiment, the RFID IC chip 1308 is embedded into the center ring structure 1350 using methods known in the art (e.g., FSA). The chip 1308 may also be placed into the center ring structure 1350 using other methods. The center ring structure 1350 is a second substrate that is adhered, coupled, or otherwise attached to the substrate 1320 of the CD 1300 at the center portion 1302. The center ring structure 1350 includes a receptor (not labeled) that may be configured to receive the chip 1308. Alternatively, the chip 1308 may also be adhered to the center ring structure 1350 using a convenient technique such as using adhesive. A conductive layer 1310 is then formed on the center ring structure 1350 and interconnected to and extended from the chip 1308. The chip 1308 may include contact pads (not labeled) that the conductive layer 1310 is connected to. The center ring structure 1350 is placed over the CD 1300 at the center portion 1302. The center ring structure 1350 may cover the entire center portion 1302 or may only cover a portion of the center portion 13002. The center ring structure 1350 is placed on the CD 1300 such that the chip 1308 and portions of the conductive layer 1310 are not in physical contacts with a part of the CD that comprises the metalization layer 1322. In one embodiment, the conductive layer 1310 has a circular configuration and does not have a part that overlaps the part of the CD that comprises the metalization layer 1322. The RFID transponder 1366 forms a capacitive coupling to the metalization layer 1322 utilizing the metalization layer 1322 as an antenna layer.

In one embodiment, the RFID transponder 1366 includes one or more weight balancing components 1340 similar to previous embodiments (FIGS. 22-23). The weight balancing components 1340 may be placed or embedded directly into the center ring structure 1350. Alternatively, the weight balancing components 1340 may be placed along the center portion 1302 in a predetermined fashion so as to achieve a balance spinning weight for the CD 1300 after the RFID transponder 1366 is affixed thereto.

In one embodiment, a label, not shown may be placed over the entire surface of the CD 1300 after the RFID transponder 1366 is incorporated into the CD 1300. The label may cover all areas of the CD 1300 except for the opening 1304.

Figure 24:
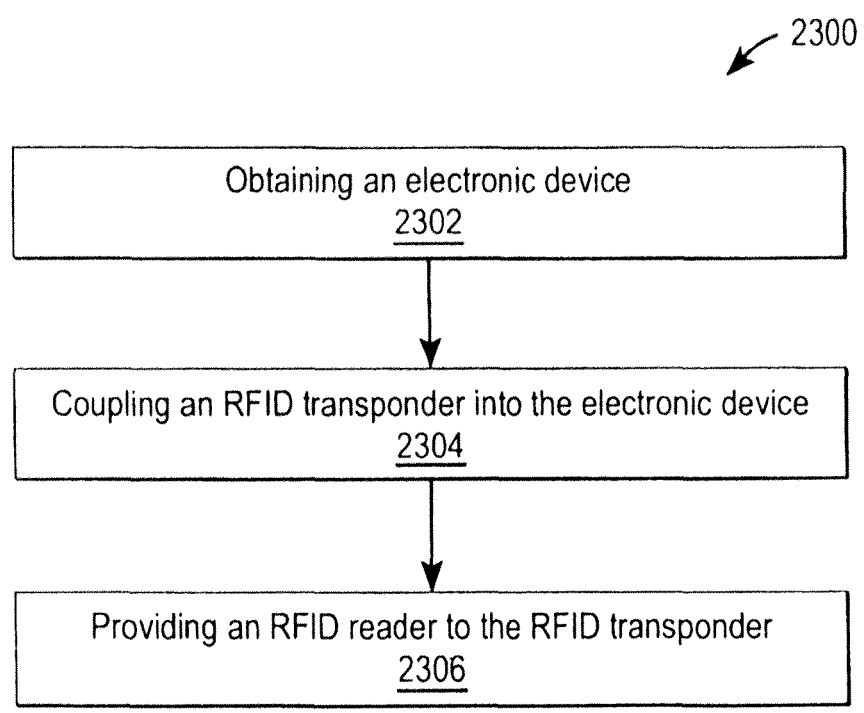
FIG. 24 illustrates an exemplary method of identifying a device that incorporates an RFID transponder.

FIG. 24 illustrates an exemplary method 2300 of processing an electronic device in accordance to embodiments of the present invention. The electronic device may be a CD 1300 or other electronic device such as a CD, CD-ROM, CD-R, CD-RW, CD-I, DVD, DVD-ROM, DVD-R, and DVD-RAM. Processing the device includes tagging which may include, but is not limited to identifying, authenticating, recognizing, inventorying, checking-in, checking-out, tracking, locating, and sensing the electronic device. In the embodiments of the present invention, tagging is achieved using an RFID system comprises using an RFID reader and an RFID transponder made in accordance to embodiments of the present invention. At box 2302, an electronic device with identification information for the electronic device is provided. As previously described, the electronic device comprises a first substrate having a metalization layer formed on the substrate, a cap layer covering at least all of the metalization layer and at least a portion of the substrate is not covered by the metalization layer. At box 2304, an RFID transponder according to embodiments of the present invention is obtained. The RFID transponder is incorporated into the device as previously described. The RFID tag includes an RFID circuit chip that is capacitively coupled to the metalization layer thus creating the RFID transponder. At box 2306, an RFID reader receptive of the RFID transponder is provided. The RFID transponder comprises the identification information and is incorporated into the electronic device.

In another embodiment, a method similar to method 2300 is provided. The method similar to method 2300 except that the RFID transponder includes the integrated circuit chip coupled to the first substrate and placed in proximity and in non-physical contact with the metalization layer and a conductive layer attached to the integrated circuit chip and having at least a portion placed in a non-physical contact with the metalization layer. The integrated circuit chip is capacitively coupled to the metalization layer through the conductive layer and the metalization layer.

In another embodiment, a method similar to method 2300 is provided. The method similar to method 2300 except that the RFID transponder includes a label placed over the substrate, an integrated circuit chip coupled to the label, and a conductive layer attached to the integrated circuit chip. The integrated circuit chip is placed in proximity and in non-physical contact with the metalization layer. The conductive layer has at least a portion placed in a non-physical contact with the metalization layer. The integrated circuit chip is capacitively coupled to the metalization layer through the conductive layer and the metalization layer.

In another embodiment, a method similar to method 2300 is provided. The method similar to method 2300 except that the RFID transponder is formed in a center ring substrate as previously described. At least a central portion of the substrate not covered by the metalization layer and a center ring substrate placed over the central portion. The center ring substrate comprises an integrated circuit chip disposed therein. A conductive layer is attached to the integrated circuit chip. One or more weight balancing components are deposited on the center ring substrate. The integrated circuit chip is placed such that the integrated circuit chip is in proximity and in non-physical contact with the metalization layer. The conductive layer has at least a portion placed in a non-physical contact with the metalization layer. The integrated circuit chip is capacitively coupled to the metalization layer through the conductive layer and the metalization layer.

In one embodiment, an electronic device such as a CD or DVD is tagged using an RFID transponder that is incorporated directly into the electronic device in accordance to exemplary embodiments of the present invention. In one embodiment, a CD or DVD is tagged using such RFID transponder.

In another embodiment, a device such as a CD or DVD that is tagged using an RFID transponder that is incorporated directly into the electronic device is checked in or out of a library using a complimentary RFID reader, wherein the RFID transponder includes information or identification information about the device and communicates/transmits the information the RFID reader, which identifies the information accordingly and facilitates the checking in and/or checking out of the item. In one embodiment, when the device is returned to the library, the RFID reader picks up the information from the RFID transponder incorporated on the device and automatically identifies and facilitates the check in process of the device at the library.

In one embodiment, the RFID transponder functions as a security device for an electronic device that incorporates the RFID transponder directly into the electronic device. The RFID transponder sends a signal to a security gate which includes an RFID reader and is positioned at a particular location as the device passes through the gate. The RFID transponder allows the device to be detected and/or checked out. Such security gate may be included at a retailer selling the device, a rental store renting the device, or a library maintaining the device.

In one embodiment, the RFID transponder enables automatic check in and/or check out of an electronic device that incorporates the RFID transponder directly into the electronic device. When an RFID reader is provided, the device with the RFID transponder can be automatically detected for checking in and checking out process.

In one embodiment, the RFID transponder facilitates sorting of a device returned to a particular location such as a library or a rental store. When an electronic device includes an RFID transponder that is incorporated directly into the device, when the device is return to appropriate location where an RFID reader is placed, the item is detected and automatically checked in. In one embodiment, an RFID-enable automatic sorter is provided. The RFID-enable automatic sorter picks up signal from the RFID transponder on the device, automatically checks in the device, and automatically sorts and/or places the device into an appropriate location/container according to the information provided in the RFID transponder.

In one embodiment, the RFID transponder facilitates shelving, organizing, locating, identifying, or tracking, or other similar task an electronic device that incorporates the RFID transponder directly into the electronic device. An RFID reader is provided. The RFID reader can scan or pick up signals from the device's RFID transponder and enters or checks the location of the device which facilitates shelving, organizing, locating, identifying, tracking, or other similar task of the device.

Other aspects of the invention relate to content protection. For example, an RFID IC may be integrated with a device such as a CD or DVD and may, (in addition to or an alternative to identifying, through a contactless, wireless manner, the particular CD or the content on the CD) provide a way to prevent successful copying of the CD, DVD, or other machine readable medium. In this example, the RFID IC is embedded within the CD itself and may be read by a reader in the CD player. The RFID IC may transmit a code (which may be encoded or encrypted) to the reader in the CD player (or within the system which includes the CD player), and the CD player can process this code to determine whether the CD is authentic (and not a pirated copy). There are numerous possible implementations for protecting the content of a CD or other machine readable media with an RFID IC embedded within the storage medium such as a CD.

One implementation may merely involve wireless by reading a code or value from the RFID IC when the machine readable medium (which contains the RFID IC) is placed into a playback device (e.g., a CD player) and comparing this code or value to a code or value read from the machine readable medium. If the codes or values match, then the playback device "knows" that the machine readable medium is authentic. If the codes or values do not match, then the playback device "knows" that the machine readable medium is NOT authentic and the playback device will refuse to playback (or otherwise interact with) the medium and may cause the medium to be ejected. The playback device would normally include a standard playback device (e.g., a CD laser and head and associated electronics and motors) and an RFID reader which transmits an interrogation signal to the RFID IC in the machine readable medium and which receives a response from the transponding RFID IC which is embedded with the machine readable medium which is inserted into the playback device.

Figure 25:
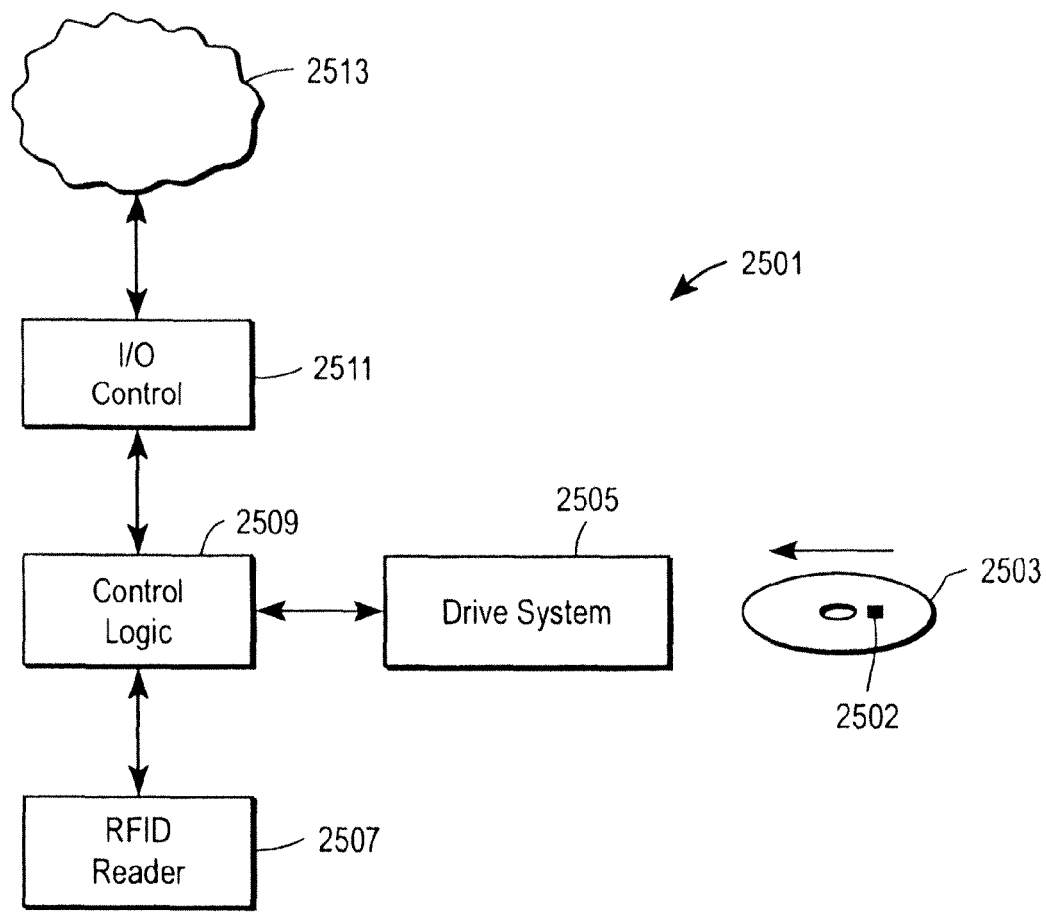
FIG. 25 illustrates an exemplary playback system for use in one exemplary aspect of the present invention.

FIG. 25 shows an example of a playback system for use in one exemplary aspect of the invention. The playback system 2501 may be a stand-alone CD player or DVD player or may be part of a larger system (e.g., the playback system 2501 may be a CD/DVD drive in a general purpose computer system). The playback system 2501 is designed to receive a machine readable medium 2503 (which may be a CD, DVD, etc.) which includes an RFID IC 2502. The RFID IC 2502 includes one or more codes or values which identify the medium and which can also be used to prevent successful copying of the content stored on the medium. A drive system 2505 receives the medium 2503 and positions the medium 2503 relative to a read head (e.g., a CD laser and detector head). The drive system 2505 is coupled to and controlled by the control logic 2509. The control logic 2509 controls the drive system 2505 and also controls the operation of and receives signals (e.g., codes or values) from the RFID reader 2507. These signals are obtained from the RFID IC. The Input/Output ("I/O") control 2511 is coupled to the control logic 2509 in order to provide an output and/or input to the playback system 2501. The I/O control 2511 may receive audio or audiovisual data from the medium 2503 and provide this data to speakers or a display device or to another subsystem (e.g., portions of a computer or TV). The control logic 2509 may perform the comparisons described above (e.g., matching a code from the RFID IC with a code stored in the medium 2503) in order to verify that the medium is authentic. Other alternative playback architectures may be implemented with an RFID reader which reads an RFID IC embedded with a machine readable medium.

Another exemplary implementation may, rather than merely determining whether a value read from the RFID IC matches a value read from the machine readable medium which contains the RFID IC, use an encoding scheme or encryption scheme to make copying difficult. One or more values stored in the RFID IC may be encoded and/or encrypted and one or more values stored on the machine readable medium may also be encoded and/or encrypted, and the playback device processes these values to determine whether the content of the machine readable medium is authentic. For example, if each CD or other medium from a particular source (e.g., Microsoft) has a serial number, that serial number may be encrypted (e.g., with a private key of a public key/private key system) and stored in the RFID IC. When the playback device reads the RFID IC, it retrieves this encrypted serial number and decrypts this number (e.g., with the source's public key) to obtain the unencrypted ("clear") serial number and compares this serial number from the RFID IC to the serial number stored on the medium. If there is a match then the medium is authentic and if there is no match then it is not authentic. Numerous other encoding schemes or encryption schemes which are known in the art may alternatively be applied.

Several embodiments discussed above pertain to incorporations of an RFID transponder into an electronic item that includes therein a metalization layer. The metalization layer of such electronic item performs particular functions (e.g., storing information and executing instructions) and as such should not be altered. In another group of embodiments, an RFID transponder is incorporated into an item that may include or otherwise allow a conductive layer or a metalization layer to be attached to the item. The conductive layer for this item may not necessarily perform any electronic function such as the metalization layer for a CD disc previously discussed. The conductive layer for this item may function as a tampered proof, protective, cover, a sealing, or an identification layer or label for an item or a packaging of an item. In these embodiments, the conductive layer itself may be physically altered or configured so that the conductive layer can act as a part of an antenna and/or a resonance structure for an RFID transponder. With such physical alteration, the conductive layer can then have an additional function, to act as a part of an antenna and/or a resonance structure for the RFID transponder. An RFID integrated circuit chip is interconnected to the conductive layer to form an RFID transponder. The item with such RFID transponder included can then be tagged, authenticated, tracked, or the like using an RFID system as previously described. These embodiments are particularly useful to incorporate an RFID system into a pharmaceutical item, a Blister Pack, a medicine bottle, a food item, a bottle, or any other merchandise that may currently include a conductive layer such as a foil layer in its packaging.

Currently, numerous items are being packaged in tamper-proof packaging that includes a foil layer or other conductive material. Such items include medicine, personal product (e.g., toothpaste, mouthwash, cosmetic product), food, wine, cellular/wireless device, memory card, electronic device, etc. It is typical to find a foil sealing over an opening of a bottle or a tube that contains a product wherein breakage in the sealing would indicate that the product has been opened, used, tested, or otherwise tampered with. It is also typical to find a product packaged in a Blister Pack or a Blister Pack like packaging that include a metallic or a foil layer. In many instances, these types of packaging or sealing also allow for displays of the item or product contained within the packages as well as providing security or authenticity of the item, theft resistant or indicator for the item, and/or tamper-proof packaging for the item.

Figure 26:
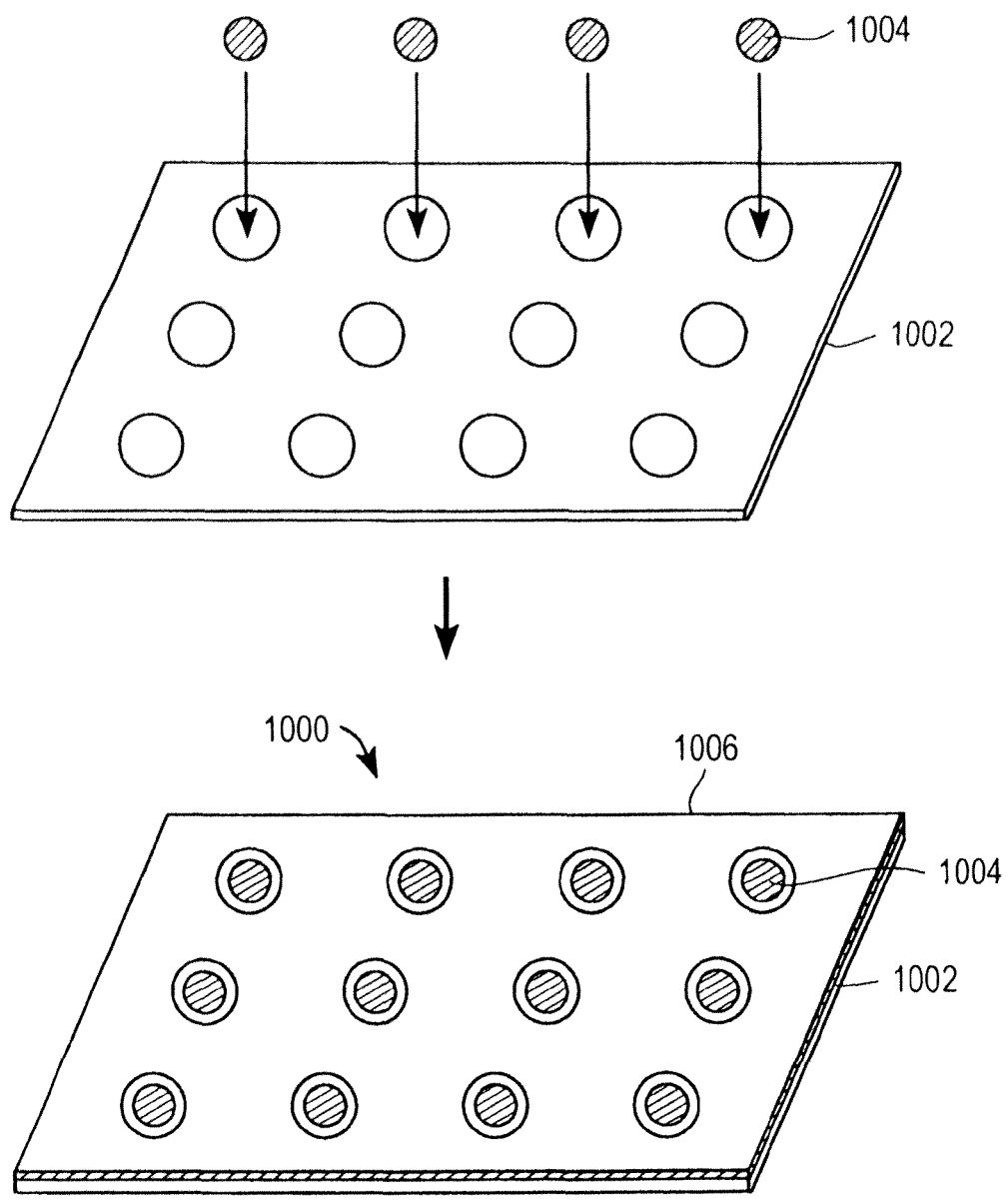
FIG. 26 illustrates an exemplary Blister Pack that can benefit from various embodiments of the present invention.

FIG. 26 illustrates a typical blister pack 1000 that includes a thermoformed "blister" or tray 1002 which houses an item or product or a plurality of such item or product 1004. A "blister card" or cover 1006, which may be a printed card with an adhesive coating, is adhered on the front surface of the tray 1002. The blister/tray 1002 is attached to the blister card/cover 1006 using a machine that may also be used to package the product between the tray and the cover. The blister pack can be as small or as large as desired for the particular product. The blister pack typically includes a foil layer, which could be the cover 1006 in many instances. In accordance to embodiments of the present invention, this foil layer is made to include one or more slots and an RFID integrated circuit chip placed over a portion of the slot (see below, FIGS. 28-31). The foil layer functions as a part of an antenna and/or resonator and together with the RFID integrated circuit chip functions as an RFID transponder.

Figure 27:
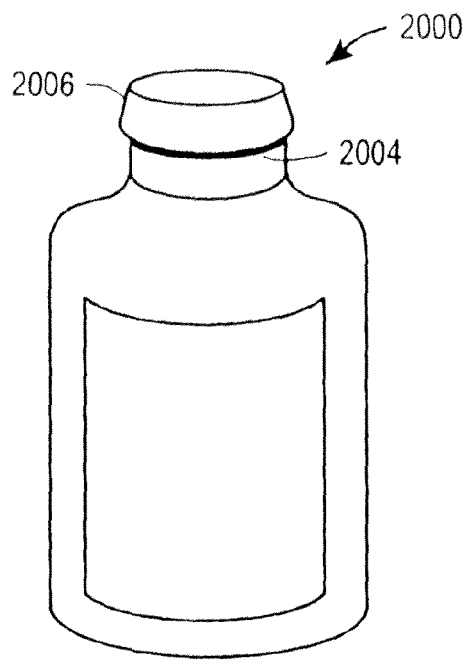
FIG. 27 illustrates an exemplary bottle that can benefit from various embodiments of the present invention.

FIG. 27 illustrates a medicine bottle 2000 that may include a tampered proof foil layer 2004. The bottle 2000 typically stores a particular medicine. To ensure that a consumer purchase an un-opened or untampered bottle, a sealing cover such as the foil layer 2004 is placed over the mouth or opening of the bottle 2000. A cap/cover 2006 is also typically placed over the bottle 2000. In accordance with embodiments of the present invention, this foil layer 2004 can be made to include one or more slots and an RFID integrated circuit chip placed over a portion of the slot (see below, FIGS. 32-33). The foil layer functions as a part of an antenna and/or resonator and together with the RFID integrated circuit chip functions as an RFID transponder. Similar implementations can be applied to other items such as food, cosmetic products, or personal products.

Figure 28:
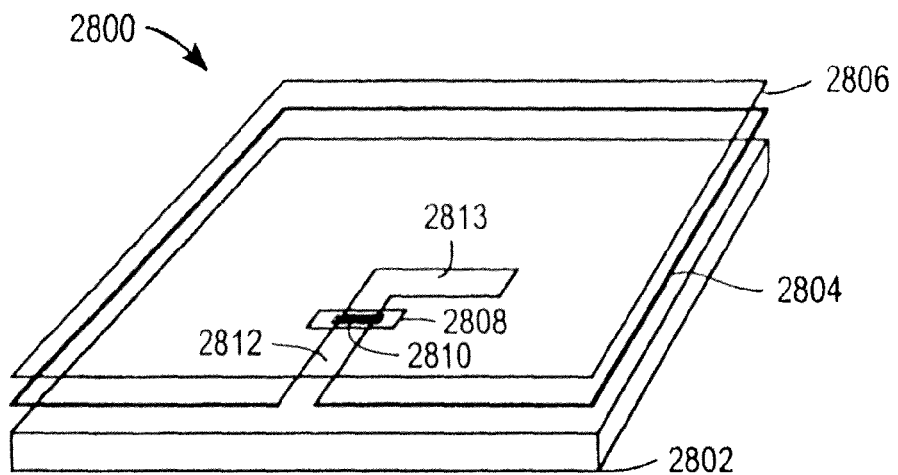
FIGS. 28-29 illustrate an exemplary embodiment of incorporating an RFID transponder into an item in accordance to embodiments of the present invention.

FIG. 28 illustrates an exemplary embodiment of a conductive layer 2804 (e.g., a foil layer) that is configured so that it can function as a part of an antenna structure for an RFID device 2800. Additionally, the conductive layer 2804 can also be configured to be a part of or a resonator for the RFID device 2800. In the present embodiment, the RFID device 2800 (also referred to as an RFID tag or transponder) comprises a substrate 2802 upon which the conductive layer 2804 is formed. The conductive layer 2804 includes an opening line or slot 2812. The opening line 2812 is typically a slot cut through a portion of the conductive layer 2804. The slot 2812 transforms the conductive layer 2804 into a part of an antenna structure that can be used for an RFID system. The opening line 2812 can be etched, laser cut, or otherwise formed into the conductive layer 2804 using methods known in the art. The opening line 2812 can also function as a separator that creates two sides for the conductive layer 2804 so that the conductive layer 2804 can function as a part of an antenna and can be coupled to a circuit component without shorting out. The opening line 2812 also allows the conductive layer 2804 to be configured like a loop or two-plates antenna. In one embodiment, the opening line 2812 has a width of about 0.5-5 mm.

In one embodiment, an additional opening line 2813 is formed in the conductive layer 2804. The additional opening line 2813 can extend from the opening line 2812 or can intersect with the opening line 2812 as illustrated in FIG. 28.

In one embodiment, the additional opening line 2813 functions as a resonator for the RFID tag 2800. The length of the opening line 2813 corresponds to a particular frequency that the RFID tag 2800 is to be operated in. For instance, for an operating frequency of about 800-950 MHz, the opening line 2813 may have a length of about 1-1.5 inches. The length of the opening line 2813 is inversely proportional to the operating frequency level for the RFID tag 2800. In another example, for an operating frequency of about 2-3 GHz, the opening line 2813 may have a length of about 0.2-0.5 inches.

As illustrated in FIG. 28, an RFID integrated circuit chip 2810 is placed over a portion of the opening line 2812. The RFID integrated circuit chip 2810 is electrically interconnected to the conductive layer 2804. The RFID integrated circuit chip 2810 can be similar to the circuit chip 304 (FIG. 3) previously discussed. The RFID integrated circuit chip 2810 can be a conventional integrated circuit configured to work for an RFID system.

Figure 29:
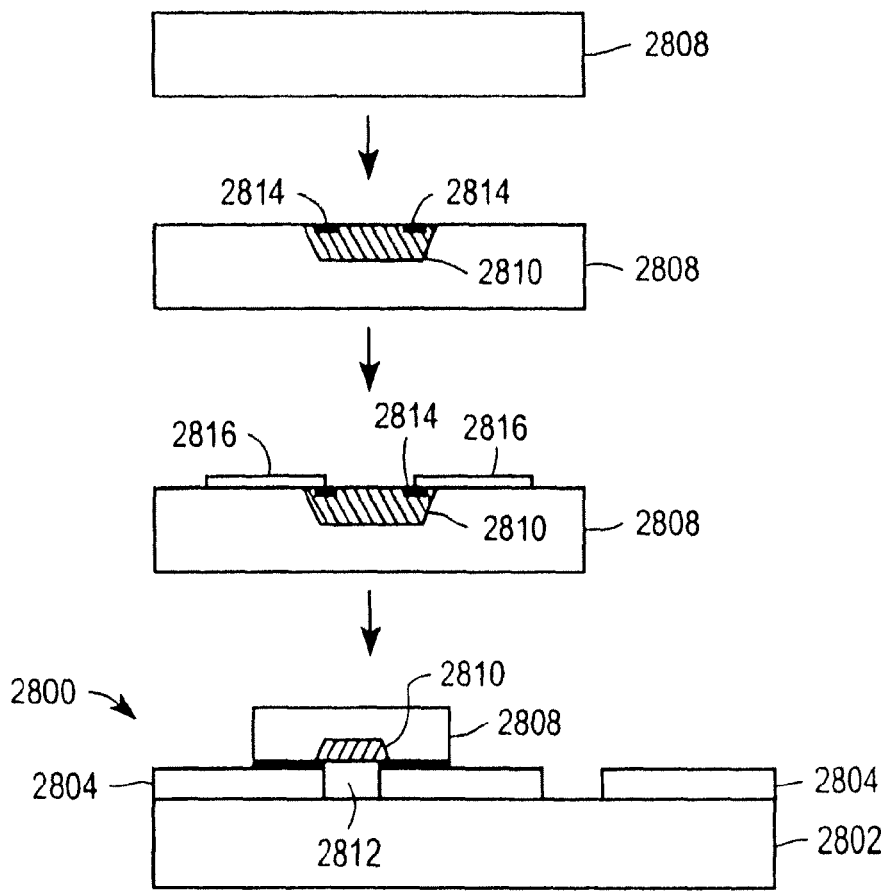

In one embodiment, the RFID integrated circuit chip 2810 is placed, deposited, or recessed in a strap substrate 2808 (FIG. 29) prior to being interconnected to the conductive layer 2804. In one embodiment, the strap substrate 2808 is provided. The strap substrate 2808 may include a receptor (not labeled) configured to receive the RFID integrated circuit chip 2810 in the form of a block that include the necessary circuit or electrical component formed thereon (similar to previously discussed with reference to FIGS. 3-4). The RFID integrated circuit chip 2810 may be deposited into the receptor using FSA as previously discussed (FIG. 29). Alternatively, the RFID integrated circuit chip 2810 is recessed into the strap substrate 2808 using other suitable methods or techniques. The RFID integrated circuit chip 2810 may include one or more contact pads 2814 used to electrically interconnect the electrical component to the conductive layer 2804. Additional contact pads may also be included for other purposes. In some embodiments, the RFID integrated circuit chip 2810 may include an interconnect feature 2816 to provide additional contact area for the RFID integrated circuit chip 2810. The interconnect feature 2816 may also increase or act as a resonator for the RFID tag that the RFID IC chip 2810 is included or coupled to. After the RFID integrated circuit chip 2808 is deposited into the strap substrate 2808, the strap substrate 2808 is placed over the opening line 2812 as illustrated in FIGS. 28-29. In one embodiment, the strap substrate 2808 is placed upside down so that the RFID IC chip 2810 is facing the conductive layer 2804.

In one embodiment, a protective layer or a cap layer 2806 is placed over the substrate 2802 as illustrated in FIG. 28. The protective layer 2806 serves to prevent damages to the RFID integrated circuit chip 2810 as well as the conductive layer 2804. The protective layer 2806 can also function to serve as a sealing or a tamper-proof indicator since a slot or an opening is formed into the conductive layer 2804.

Adhesive layers (not shown) may be used to couple the substrate 2802 to the conductive layer 2804 and/or to couple the conductive layer 2804 to the protective layer 2086. Additionally, adhesive may also be used to couple the RFID integrated circuit chip 2808 to the conductive layer 2804 as previously discussed. Other methods or mechanical coupling can also be used, e.g., soldering.

Figure 30:
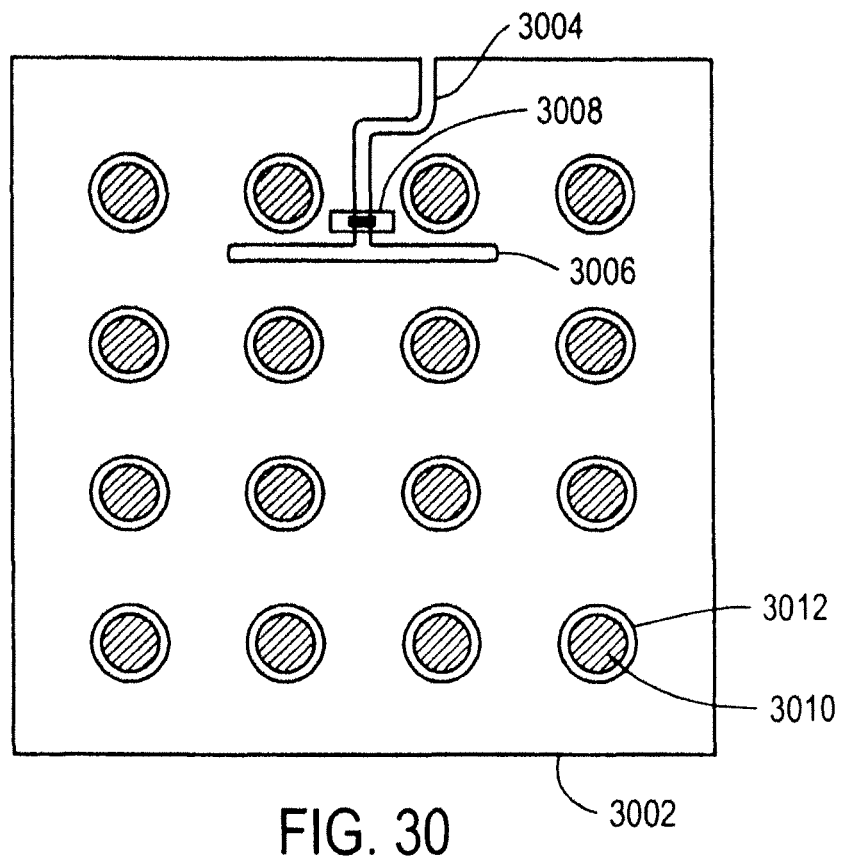
FIGS. 30-31 illustrate an exemplary embodiment of incorporating an RFID transponder into a Blister Pack in accordance with embodiments of the present invention.
Figure 31:
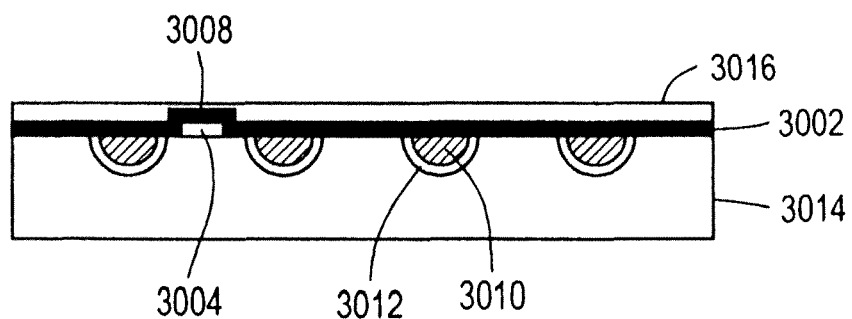

The conductive layer 2804 described can be incorporated or build into a Blister Pack for a pharmaceutical product as previously mentioned. FIGS. 30-31 illustrate an exemplary embodiment of a pharmaceutical product that includes a Blister Pack with an RFID tag made in accordance to embodiments of the present invention. As illustrated in FIGS. 30-31, a conductive layer (or a foil layer) 3002 is provided with a slot 3004 and a slot 3006. An RFID integrated circuit chip 3008 is placed over a portion of the slot 30046. The conductive layer 3002 is placed over a substrate 3014. The substrate 3014 is a tray with feature 3012 that is configured to house a medicine tablet or a plurality of medicine tablets 3010. In one embodiment, when the conductive layer 3002 and the substrate 3014 are adhered to each other, the tablets 3010 are housed between the conductive layer 3002 and the substrate 3014 as shown in FIG. 31. A protective layer 3016 may also be placed over the conductive layer to protect the conductive layer 3002 and the RFID integrated circuit chip 3008. In another embodiment, the conductive layer 3002 is the layer with the features 3012 that can receive the tablets 3010. In yet another embodiment, the conductive layer 3002 is simply a label of the Blister Pack.

Figure 32:
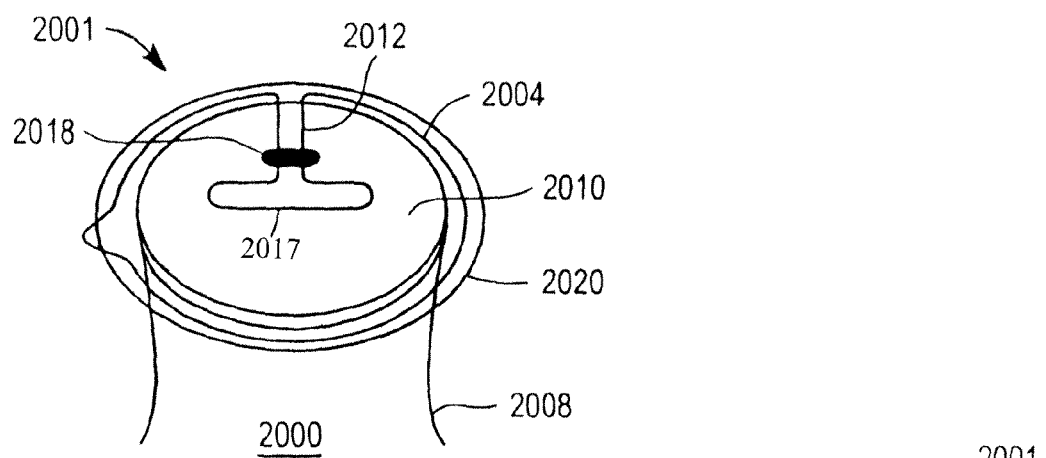
FIGS. 32-33 illustrate an exemplary embodiment of incorporating an RFID transponder into a bottle in accordance with embodiments of the present invention.
Figure 33:
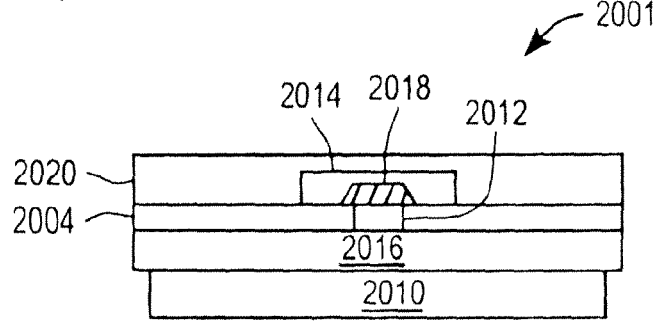

FIGS. 32-33 illustrates an exemplary embodiment of a conductive layer 2004 (e.g., a foil layer) that is altered so that it can function as a part of an antenna and/or a resonator structure and can accommodate and interconnect to an RFID integrated circuit chip 2018 for an RFID device 2001. The RFID device 2001 also functions as a protective sealing or a sealing cap for an item such as the medicine bottle 2000 shown in FIG. 27. In the present embodiment, the bottle 2000 includes a sealing layer that includes a conductive layer 2004 placed over the opening 2010 of the bottle 2000. The bottle 2000 may include a bottle neck 2008 as is typically known in the art.

In one embodiment, to provide the bottle 2000 with an RFID device 2001, a substrate layer 2016 is placed over the opening 2010. A conductive layer (e.g., a foil layer) 2004 is placed over the substrate 2016. A slot 2012 is created in the conductive layer 2004. As previously mentioned, the slot 2012 created into the conductive layer 2004 enables the conductive layer 2004 to be configured to be a part of an antenna structure for the RFID device 2001. An RFID integrated circuit chip 2018 is placed over the slot 2012 to interconnect the RFID integrated circuit chip 2018 to the conductive layer 2004. Additional slot such as slot 2017 can also be included to add resonance to the RFID device 2001. The length of the slot 2017 corresponds to the desired frequency for the RFID device. In one embodiment, the slot 2017 has a length of about 1-1.5 inches which will enable the RFID device 2001 to operate in the range of about 800-950 MHz. In one embodiment, the slot 2017 has a length of about 0.2-0.5 inches which will enable the RFID device 2001 to operate in the range of about 2-3 GHz. In one embodiment, the RFID integrated circuit chip 2018 is recessed within a strap substrate 2014 as previously discussed. The strap substrate 2014 is then placed over the slot 2012 in a way that enable the RFID integrated circuit chip 2018 to interconnect to the conductive layer 2004. In one embodiment, a protective layer 2020 is placed over the conductive layer 2004 and the RFID integrated circuit chip 2018.

In some instances, the substrate 2016, the conductive layer 2004, the RFID integrated circuit chip 2018 (or the RFID integrated circuit chip 2018 recessed in the strap substrate 2014), and the protective layer 2020 are assembled together and then placed over the opening 2010 of the bottle 2000. The assembly with all the components thus acts as a tamper-proof sealing as well as an RFID tag for the bottle 2000. In this embodiment, the material or content within the bottle 2000 can be authenticated, tagged, controlled, and/or protected using a conventional RFID system that works with the RFID tag installed on the bottle 2000. Additionally, no new complicated processing step is needed to add to the assembling or packaging of the bottle 2000 to add an RFID feature to the bottle 2000.

Figure 34:
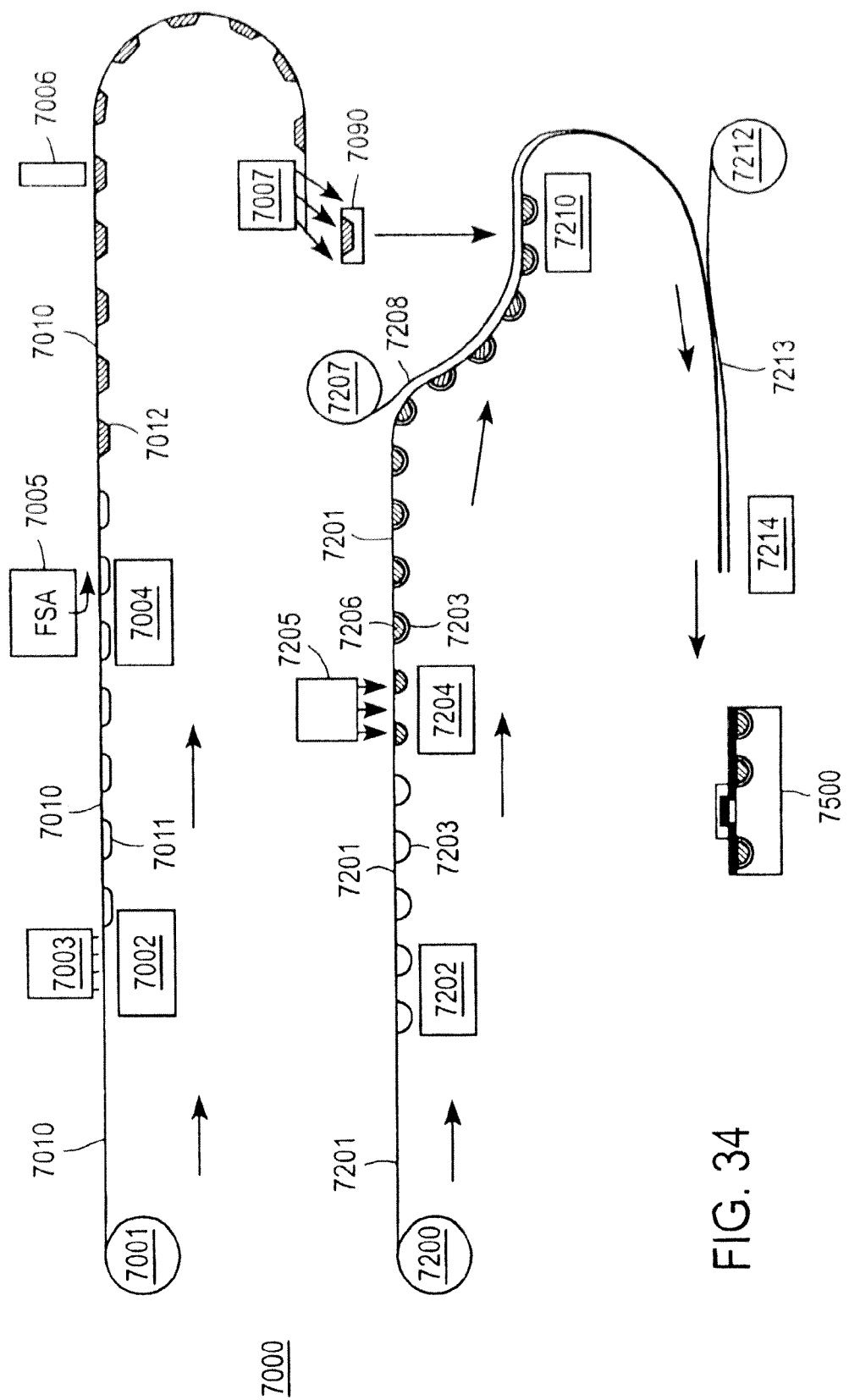
FIG. 34 illustrates an exemplary process of incorporating an RFID transponder into an item in accordance with embodiments of the present invention.

FIG. 34 illustrates an exemplary web process 7000 of assembling a packaging, such as a Blister Pack, that houses one or more items, such as a medicine tablet. The particular Blister Pack is assembled to include an RFID transponder so that the Blister Pack can be a tamper-proof packaging for the medicine tablet as well as providing a tagging and authentication tool for the medicine tablet. It is to be noted that although a web processing is convenient for assembling the packaging for the item with the Blister Pack, other processing method can be used.

At location 7001, material for an RFID strap substrate 7010 is provided. In one embodiment, the RFID strap substrate 7010 is provided in a roll format. At location 7002, recesses 7011 are created into the strap substrate 7010 using a tool 7003, which could be a molding tool or an embossing device. Each recess 7011 is configured to receive an RFID integrated circuit chip. Each recess 7011 may have a shape complimentary to the shape of the RFID integrated circuit chip as previously discussed. After the recess 7011 is created, the strap substrate 7010 is advanced to location 7004. At the location 7004, an RFID integrated circuit chip 7012 is deposited into the recess 7011. The RFID integrated circuit chip 7012 can be a shaped block or object that includes electronic component for the RFID integrated circuit chip 7012. In one embodiment, an FSA process is used to deposit the RFID integrated circuit chip 7012 into the recess 7011. An inspection tool can be provided at location 7006. At the location 7006, the strap substrate 7010 can be inspected for recesses 7011 that are not filled or properly filled with the RFID integrated circuit chips 7012. At the location 7006, the RFID integrated circuit chips 7012 can also be inspected for functionality and other necessary inspection. At location 7007, in embodiment where the strap substrate 7010 is in a roll format, the web can be singulated, separated, cut, or sliced to produce individual strap substrate 7010 that comprises the RFID integrated circuit chip 7012 deposited therein (RFID strap 7090).

At location 7200, a Blister Pack substrate 7201 is provided. In one embodiment, the Blister Pack substrate 7201 is provided in a roll format. At location 7202, recesses 7203 are created into the Blister Pack substrate 7201. In alternative embodiments, the Blister Pack substrate 7207 already includes recesses 7203 created therein. In yet other alternative embodiments, the Blister Pack substrate 7207 includes designated areas 7203 reserved for items 7206 (e.g., medicine tablets) to be placed thereon. At location 7205, items 7206 are placed on the Blister Pack substrate 7201. At location 7207, a conductive layer 7208 is placed over the Blister Pack substrate 7201. In some embodiments, an additional layer (not shown) may be placed over the items before the conductive layer 7208 is placed over the Blister Pack substrate 7201. The conductive layer 7208 includes slots (not shown) created therein as previously discussed. At location 7210, individual RFID strap 7090 that comprises the RFID integrated circuit chip 7012 deposited therein is placed over the conductive layer 7208 as previously discussed. The individual RFID strap 7090 is placed over the conductive layer 7208 in a way that enable interconnection between the RFID integrated circuit chip 7012 and the conductive layer 7208 as previously discussed. The RFID integrated circuit chip 7012 is placed over a portion of the slot that is formed in the conductive layer 7208. At location 7212, a protective layer 7213 is placed over the Blister Pack substrate 7201. At location 7214, the Blister Pack substrate 7201 is singulated into individual Blister Pack 7500. Each Blister Pack 7500 includes one or a plurality of items 7206 housed between the Blister Pack substrate 7201 and the conductive layer 7208 that includes the RFID integrated circuit chip 7012 attached thereto. The Blister Pack 7500 made in accordance to process 7000 includes an RFID transponder that can work with a corresponding RFID reader. It is to be noted that other conventional step of making a Blister Pack may be added to the process 7000.

Figure 35:
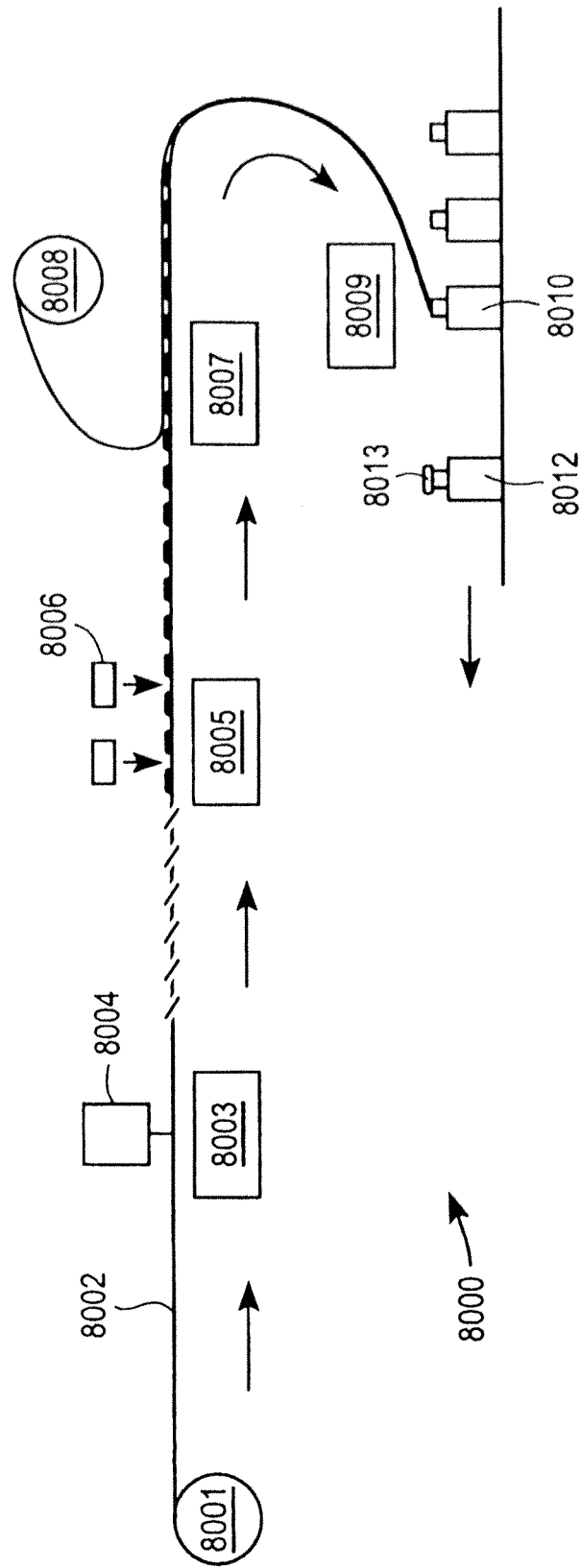
FIG. 35 illustrates another exemplary process of incorporating an RFID transponder into an item in accordance with embodiments of the present invention.

FIG. 35 illustrates an exemplary web process 8000 of assembling a packaging, such as a medicine bottle, that houses one or more items, such as a medicine tablet. The particular bottle is assembled to include an RFID transponder so that the bottle can be a tamper-proof packaging for the medicine tablet as well as providing a tagging and authentication tool for the medicine tablet. It is to be noted that although a web processing is convenient for assembling the bottle, other processing method can be used.

At location 8001, a conductive layer 8002 is provided. In some embodiments, an additional layer (not shown) may be coupled to the conductive layer 8002. In one embodiment, the conductive layer 8002 is provided in a roll format. At location 8003, slots are cut into the conductive layer 8002. A cutting tool 8004 is used to cut the slot. The slot enables the conductive layer 8002 to function as a part of an antenna structure for an RFID transponder/tag. Instead of cutting, an etching or laser cutting tool can also be used to create the slot in the conductive layer 8002. At location 8005, an RFID strap 8006 is placed over the conductive layer 8002. The RFID strap 8006 can be one that is created in the process 7000 as previously mentioned (RFID strap 7090). The RFID strap 8006 thus includes an RFID integrated circuit chip recessed therein (for example, using FSA). In one embodiment, the RFID strap 7090 processed at location 7001-7007 previously described in process 7000 (FIG. 34) is used for the RFID strap 8006 and coupled to the conductive layer 8002 at location 8005 (FIG. 35).

In one embodiment, at location 8007, a protective layer 8008 is placed over the conductive layer 8002 that now includes the RFID strap 8006 coupled thereto. At location 8009, the conductive layer 8002 with the RFID strap 8006 and protected by the protective layer 8008 is placed over an item 8010. In one embodiment, the item 8010 is a bottle such as the bottle 2000 previously discussed. In one embodiment, the conductive layer 8002 with the RFID strap 8006 and protected by the protective layer 8008 is placed over an opening of a bottle. A cap 8013 is also placed over the bottle 8010 and a bottle 8012 is then formed. The bottle 8012 thus has an RFID transponder incorporated into its sealing providing tagging, authenticating, and tamper-proofing capability for the bottle 8012.

Figure 36:
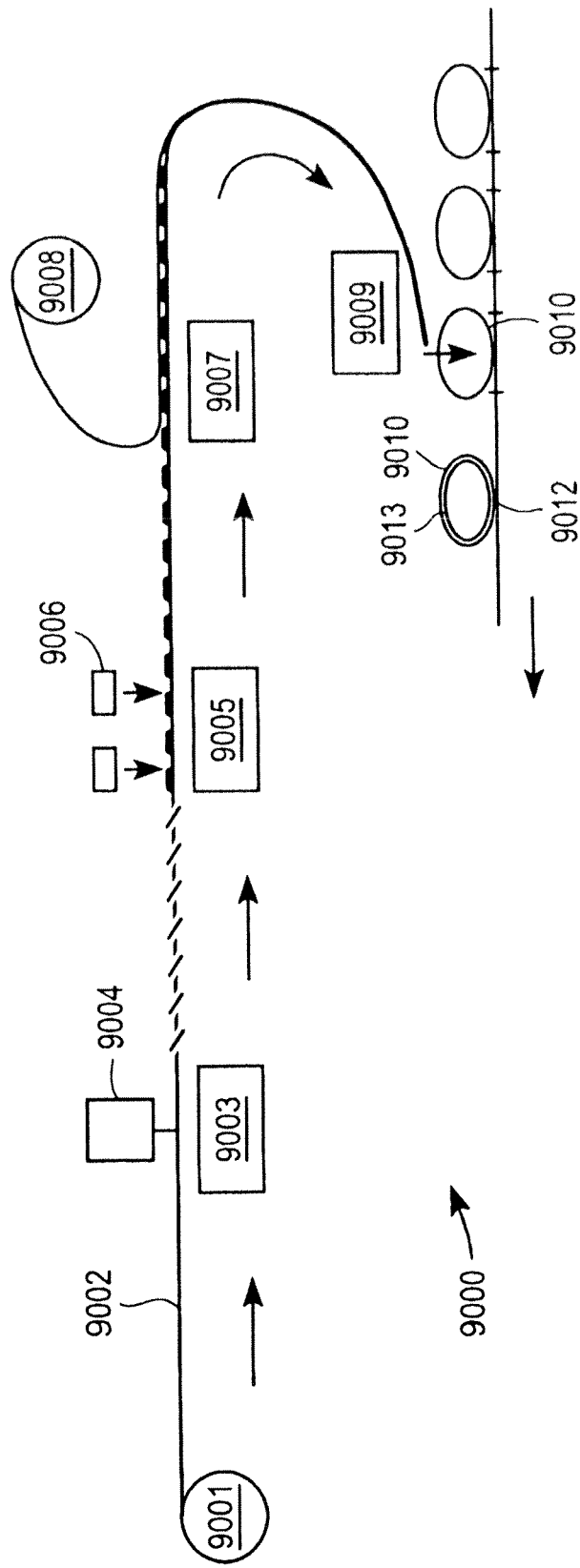
FIG. 36 illustrates yet another exemplary process of incorporating an RFID transponder into an item in accordance with embodiments of the present invention.

FIG. 36 illustrates an exemplary web process 9000 of assembling a packaging, such as a medicine bottle cap that is to be placed over a medicine bottle houses one or more items. The process 9000 is similar to the process 8000 previous described (FIG. 35) with the exception that a conductive layer with an RFID strap is placed within a cap that can be used for a bottle. The particular bottle that can be used with the cap from the process 9000 can be conventionally packaged. In the present embodiment, the cap of the bottle would be the component that includes the tagging information. The particular bottle may include other necessary sealing or tamper proof sealing as is known in the art of as described in this document. It is to be noted that although a web processing is convenient for assembling the bottle, other processing method can be used.

At location 9001, a conductive layer 9002 is provided. In some embodiments, an additional layer (not shown) may be coupled to the conductive layer 9002. In one embodiment, the conductive layer 9002 is provided in a roll format. At location 9003, slots are cut into the conductive layer 9002. A cutting tool 9004 is used to cut the slot. The slot enables the conductive layer 9002 to function as a part of an antenna structure for an RFID transponder/tag. Instead of cutting, an etching or laser cutting tool can also be used to create the slot in the conductive layer 9002. At location 9005, an RFID strap 9006 is placed over the conductive layer 9002. The RFID strap 9006 can be one that is created in the process 7000 as previously mentioned (RFID strap 7090). The RFID strap 9006 thus includes an RFID integrated circuit chip recessed therein (for example, using FSA). In one embodiment, the RFID strap substrate processed at location 7001-7007 previously described in process 7000 (FIG. 34) is used for the RFID strap substrate 9006 and coupled to the conductive layer 9002 at location 9005 (FIG. 36).

In one embodiment, at location 9007, a protective layer 9008 is placed over the conductive layer 9002 that now includes the RFID strap 9006 coupled thereto. At location 9009, the conductive layer 9002 with the RFID strap 9006 and protected by the protective layer 9008 is placed over an item 9010. In one embodiment, the item 9010 is a bottle cap. The bottle cap 9010 thus has an RFID transponder incorporated therein.

In one embodiment, an item such as a medicine pack, a medicine bottle, a food item, a beverage item, or the like is tagged using an RFID transponder that is incorporated into the packing of the item in accordance to exemplary embodiments of the present invention. The RFID transponder is incorporated into the item utilizing a conductive layer that may be included in the packaging and an RFID integrated circuit chip as previously described. A complimentary RFID reader is provided to work with the RFID transponder. In one embodiment, the RFID transponder includes information or identification information about the item and communicates/transmits the information the RFID reader, which identifies the information accordingly and facilitates the tagging, authenticating, distributing, or the like of the item.

In one embodiment, the RFID transponder functions as a security device for an item that incorporates the RFID transponder as described. For instance, the RFID transponder sends a signal to a security gate which includes an RFID reader and is positioned at a particular location as the item passes through the gate. The RFID transponder allows the item to be detected and/or checked out. Such security gate may be included at a retailer selling the device, a pharmacy, a drug store, a hospital, or other establishes that distribute or control the item. In one embodiment, the RFID transponder facilitates sorting and inventorying of an item that incorporates the RFID transponder as previously described.

In one embodiment, the RFID transponder facilitates shelving, organizing, locating, identifying, or tracking, or other similar task an item that incorporates the RFID transponder as previously described. An RFID reader is provided. The RFID reader can scan or pick up signals from the item's RFID transponder and enters or checks the location of the device which facilitates shelving, organizing, locating, identifying, tracking, or other similar task of the item.

Other aspects of the invention relate to content protection. For example, an RFID IC may be integrated with an item such as a pharmaceutical product and may, (in addition to or an alternative to identifying, through a contactless, wireless manner, the particular item) provide a way to prevent distribution of non-genuine product or replica of the item. In this example, the RFID IC is embedded within the packaging of the item (e.g., protective sealing). When the sealing is broken or otherwise tampered with, the item cannot be authenticated. There are numerous possible implementations for protecting the content of such an item with an RFID IC incorporated within the protective sealing. One implementation may merely involve wireless by reading or searching for a code or value from the RFID IC that is originally installed in the sealing. If the codes or values match and can be found in the item, then the item is authenticated. If the codes or values do not match, or simply does not exist in the sealing, then the item is not authenticated and a consumer can be alerted as to the authenticity of the item.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

I claim:
1. A device comprising:
   a first substrate layer;
   a metallization layer formed on a surface of the first substrate layer, wherein the metallization layer comprises a first slot to expose a portion of the first substrate layer; wherein the metallization layer acts as an antenna and a sealing cover for an item within a packaging;
   a radio frequency identification (RFID) chip over the portion of the first substrate layer;
   a conductive layer which couples the RFID chip to the metallization layer,
      wherein the first slot in the metallization layer determines the antenna configuration for the RFID chip.
2. The device of claim 1 wherein the antenna configuration is selected from a group consisting of loop, circular, straight, curved, folded, and dipole.
3. The device of claim 1 wherein the RFID chip is deposited in a second substrate having a receptor configured to receive the RFID chip and wherein the second substrate is adhered to the first substrate layer.
4. The device of claim 1, wherein the metallization layer has a second slot to provide a resonator for the RFID chip.
5. The device of claim 1, wherein the conductive layer comprises one or more conductive pads.
6. The device of claim 1 further comprising a conductive interconnect coupled to the conductive layer that acts as a resonator for the RFID chip.
7. The device of claim 1 wherein the packaging is at least one of a Blister Pack tray or a bottle.
8. A method for creating a device comprising:
   forming a first slot in a metallization layer to expose a portion of a surface of a first substrate layer; wherein the metallization layer acts as an antenna and a sealing cover for an item within a packaging;
   depositing a radio frequency identification (RFID) chip over the portion of the first substrate layer;
   coupling the RFID chip to the metallization layer by a conductive layer which extends from the RFID chip to the metallization layer, wherein the first slot in the metallization layer determines the antenna configuration for the RFID chip.
9. The method of claim 8 wherein the antenna configuration is selected from a group consisting of loop, circular, straight, curved, folded, and dipole.
10. The method of claim 8 further comprising:
    placing a cap layer over the conductive layer and the RFID chip.

11. The method of claim 8 further comprising:
recessing the RFID chip into a second substrate; and
coupling the second substrate to the first substrate layer.

12. The method of claim 8 wherein the first slot in the metallization layer is formed using a cutting tool.

13. The method of claim 8 further comprising
forming a second slot in the metallization layer to provide a resonator for the RFID chip.

14. The method of claim 8 further comprising
coupling the RFID chip to the metallization layer at two sides of the first slot.

15. The method of claim 8, wherein the conductive layer comprises one or more conductive pads.

16. The device of claim 1, wherein the first slot extends to an edge of the metallization layer.

17. The device of claim 1, wherein the item is deposited between the first substrate layer and the metallization layer.

18. The device of claim 1, further comprising
a cap layer over the RFID chip.

19. The method of claim 8, wherein the packaging is at least one of a Blister Pack tray or a bottle.

20. The method of claim 8, further comprising
forming a conductive interconnect to couple to the conductive layer to act as a resonator for the RFID chip.

\* \* \* \* \*